(12) United States Patent
Sugimoto

(10) Patent No.: US 12,580,539 B2
(45) Date of Patent: Mar. 17, 2026

(54) TRANSIMPEDANCE AMPLIFIER CIRCUIT

(71) Applicant: SUMITOMO ELECTRIC INDUSTRIES, LTD., Osaka (JP)

(72) Inventor: Yoshiyuki Sugimoto, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 633 days.

(21) Appl. No.: 17/660,476

(22) Filed: Apr. 25, 2022

(65) Prior Publication Data

US 2022/0352857 A1     Nov. 3, 2022

(30) Foreign Application Priority Data

Apr. 30, 2021     (JP) ................................. 2021-077469
Apr. 30, 2021     (JP) ................................. 2021-077470

(51) Int. Cl.
*H03F 3/45*      (2006.01)
*H03F 1/08*      (2006.01)
*H03F 3/19*      (2006.01)
*H03F 3/30*      (2006.01)
*H03G 3/30*      (2006.01)

(52) U.S. Cl.
CPC ......... *H03F 3/45475* (2013.01); *H03F 1/086* (2013.01); *H03F 3/19* (2013.01); *H03F 3/303* (2013.01); *H03G 3/30* (2013.01); *H03G 3/3036* (2013.01); *H03G 2201/103* (2013.01)

(58) Field of Classification Search
CPC ...... H03F 3/45475; H03F 3/303; H03F 1/086; H03F 3/19; H03G 3/30; H03G 2201/103; H03G 3/3036

USPC .......................................................... 330/254
See application file for complete search history.

(56) References Cited

U.S. PATENT DOCUMENTS 5,631,603  A  *  5/1997  Stubbe .................... H03F 1/303
                                                            330/258
7,098,718  B2 *  8/2006  Yang ......................... H03G 5/02
                                                            327/558

(Continued)

FOREIGN PATENT DOCUMENTS

CN          111327282  A  *  6/2020  .............. H03F 1/42
JP          2011-217226        10/2011
JP          2015-220567        12/2015

*Primary Examiner* — Andrea Lindgren Baltzell
*Assistant Examiner* — Lance Torbjorn Bartol
(74) *Attorney, Agent, or Firm* — IPUSA, PLLC

(57) ABSTRACT

A transimpedance amplifier circuit includes an amplifier circuit configured to convert a current signal into a voltage signal with a gain being varied based on a control signal and a gain control circuit configured to generate the control signal based on an amplitude of the voltage signal, an amplitude detection signal in accordance with the amplitude of the voltage signal, an amplitude reference signal, a differential voltage signal obtained by offsetting a voltage difference between the amplitude detection signal and the amplitude reference signal based on an amplitude setting signal, and a differential current signal based on the differential voltage signal. The gain control circuit includes a variable capacitance being varied based on the amplitude setting signal, and is configured to be charged/discharged by the differential current signal and output a charging voltage. The control signal is generated based on the charging voltage.

9 Claims, 17 Drawing Sheets

(56) References Cited

U.S. PATENT DOCUMENTS

| | | | |
|---|---|---|---|
| 8,967,478 B2 * | 3/2015 | Giebel | G06K 7/10742 |
| | | | 235/455 |
| 9,143,110 B2 * | 9/2015 | Sano | H03G 3/30 |
| 9,503,038 B2 * | 11/2016 | Wu | H03G 1/0088 |
| 11,159,146 B2 * | 10/2021 | Chang | H03H 11/0466 |
| 11,418,163 B1 * | 8/2022 | Ray | H03F 3/087 |
| 11,444,631 B2 * | 9/2022 | Ali | H03G 1/0029 |
| 2016/0072651 A1 * | 3/2016 | Welch | H04B 10/00 |
| | | | 375/286 |
| 2016/0164624 A1 | 6/2016 | Yamauchi | |
| 2016/0261246 A1 | 9/2016 | Koizumi et al. | |

* cited by examiner

TRANSIMPEDANCE AMPLIFIER CIRCUIT

CROSS-REFERENCE TO RELATED APPLICATIONS

This application claims priority to Japanese Patent Application No. 2021-077469 filed on Apr. 30, 2021, and Japanese Patent Application No. 2021-077470 filed on Apr. 30, 2021, the entire contents of which are incorporated herein by reference.

BACKGROUND

1. Field of the Invention

The present disclosure relates to a transimpedance amplifier circuit.

2. Description of the Related Art

In optical transmission systems, wavelength division multiplexing, by which multiple optical signals having different wavelengths that are multiplexed are transmitted and received using two optical fibers, is known. Additionally, a coherent receiving method is known as a method for efficiently receiving multiplexed optical signals. For example, in an optical receiver that receives one of multiple optical signals (a single optical signal), an amplifier circuit that amplifies a current signal converted from the single optical signal includes a transimpedance amplifier circuit and an auto gain control (AGC) circuit that performs variable control on the gain of the transimpedance amplifier circuit to obtain a constant amplitude of the amplified signal. Such an amplifier circuit can output signals with a wide input dynamic range and linearity, with a variable gain function in the AGC circuit.

SUMMARY

A transimpedance amplifier circuit includes an amplifier circuit configured to convert an input current signal into a voltage signal with a gain being varied in accordance with a control signal and a gain control circuit configured to generate the control signal in accordance with an amplitude of the voltage signal. The gain control circuit includes a detection circuit configured to generate an amplitude detection signal in accordance with the amplitude of the voltage signal, a setting circuit configured to generate an amplitude reference signal in accordance with a reference voltage, a differential voltage generation circuit configured to generate a differential voltage signal in accordance with a voltage difference between the amplitude detection signal and the amplitude reference signal, the differential voltage signal being obtained by offsetting the voltage difference based on an amplitude setting signal, an operational transconductance amplifier (OTA) configured to generate a differential current signal in accordance with the differential voltage signal, and a variable capacitor circuit connected to an output of the OTA, the variable capacitor circuit having a variable capacitance being varied in accordance with the amplitude setting signal, and being configured to be charged and discharged by the differential current signal and output a charging voltage. The control signal is generated in accordance with the charging voltage.

A transimpedance amplifier circuit includes an amplifier circuit configured to convert an input current signal into a voltage signal with a first gain being varied in accordance with a control signal and a gain control circuit configured to generate the control signal in accordance with an amplitude of the voltage signal. The gain control circuit includes a detection circuit configured to generate an amplitude detection signal in accordance with the amplitude of the voltage signal, a setting circuit configured to generate an amplitude reference signal in accordance with a reference voltage, a differential voltage generation circuit configured to generate a differential voltage signal in accordance with a voltage difference between the amplitude detection signal and the amplitude reference signal, the differential voltage signal being obtained by offsetting the voltage difference based on an amplitude setting signal, an operational transconductance amplifier (OTA) configured to generate a differential current signal from the differential voltage signal with a second gain being varied in accordance with the amplitude setting signal, and a capacitor circuit configured to be charged and discharged by the differential current signal and output a charging voltage. The control signal is generated in accordance with the charging voltage.

BRIEF DESCRIPTION OF THE DIAGRAMS

FIG. 1 is a block diagram illustrating an example of a configuration of a transimpedance amplifier circuit according to a first embodiment;

FIG. 6 is a block diagram illustrating an example of a configuration of a transimpedance amplifier circuit according to a second embodiment;

FIG. 8 is a circuit diagram illustrating an example of the OTA of FIG. 7;

FIG. 14 is disabled.

DETAILED DESCRIPTION

Figure 2:
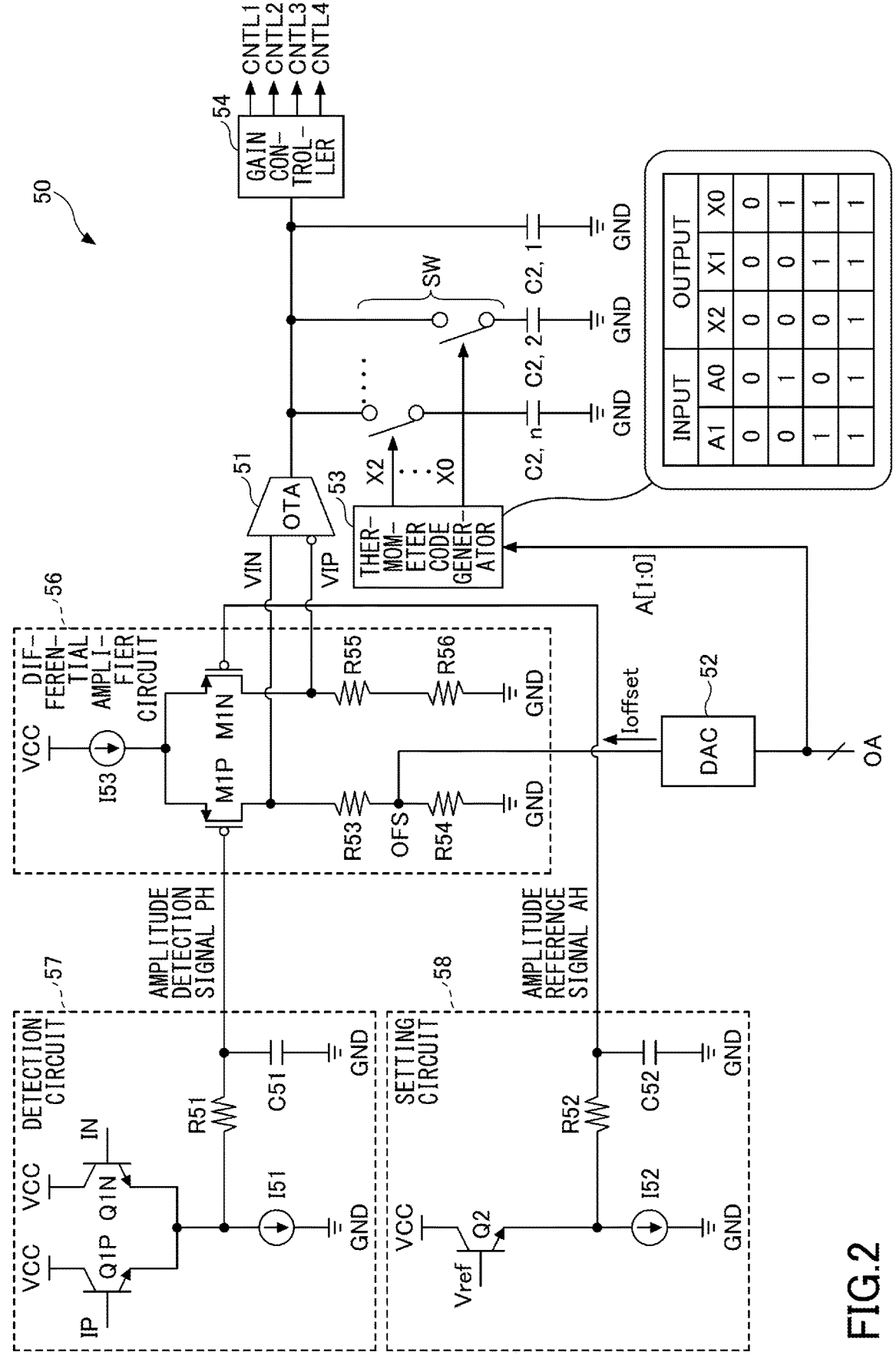
FIG. 2 is a circuit diagram illustrating an example of the AGC circuit of FIG. 1.

Details of Embodiments of the Present Disclosure

Specific examples of a transimpedance amplifier circuit of the present disclosure will be described below with reference to the drawings. In the following description, the same elements or corresponding elements are referenced by the same symbols, and the description thereof may be omitted. A symbol of the input terminal, the output terminal, or the node is also used as a symbol of the signal, the voltage, or the current.

First Embodiment

[Circuit Configuration of Transimpedance Amplifier Circuit]

Figure 1:
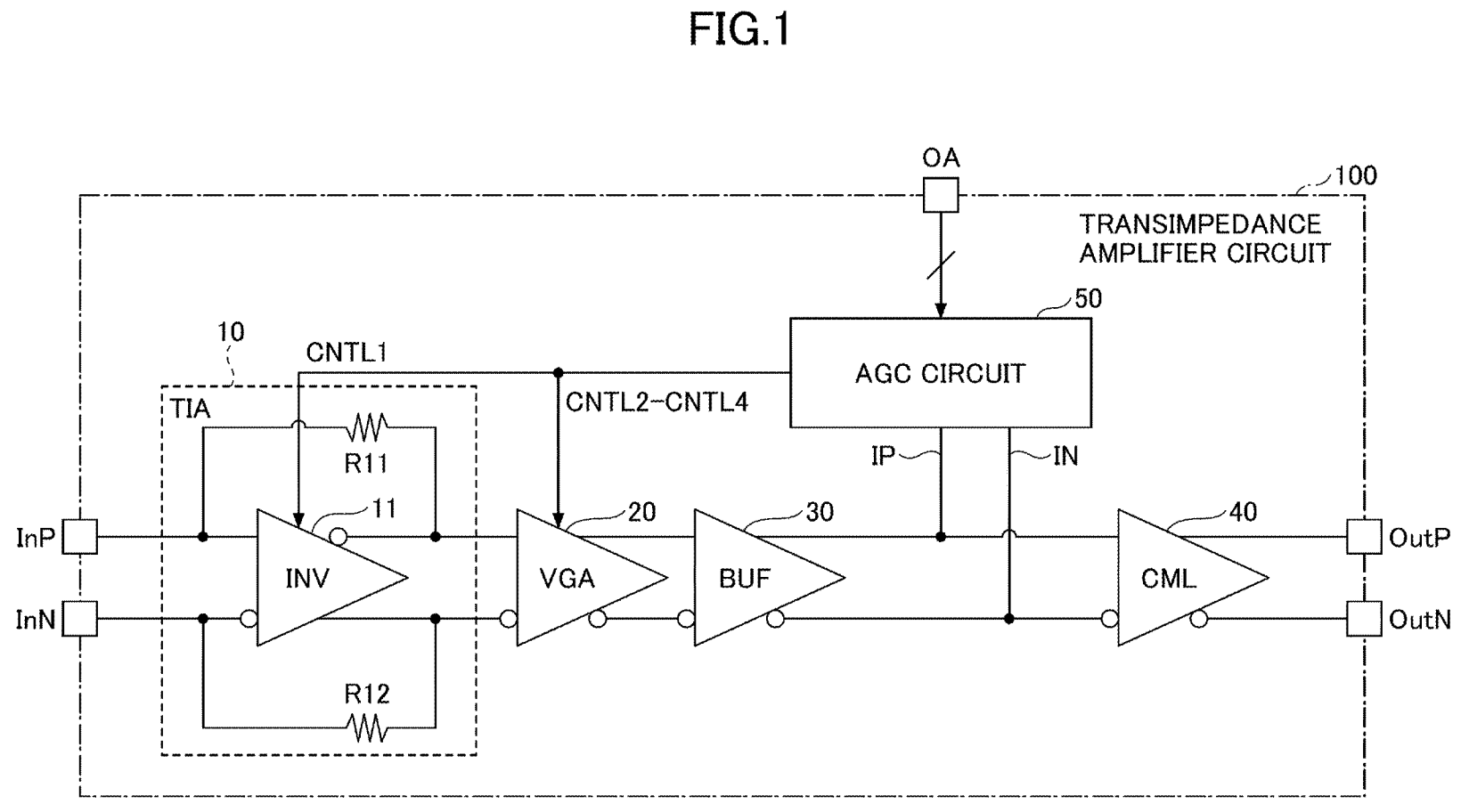

FIG. 1 is a block diagram illustrating an example of a configuration of a transimpedance amplifier circuit according to a first embodiment. A transimpedance amplifier circuit 100 illustrated in FIG. 1 includes a core amplifier 10, a variable gain amplifier (VGA) 20, a buffer (BUF) 30, a current mode logic (CML) 40, and an AGC circuit 50.

For example, the transimpedance amplifier circuit 100 is used in a coherent optical receiver to receive an optical signal, and receives, at input terminals InP and InN, differential current signals converted from an optical signal having a single wavelength by a photodiode. The transimpedance amplifier circuit 100 amplifies the received current signals and outputs the amplified results from output terminals OutP and OutN as differential voltage signals. The voltage signals output from the output terminals OutP and OutN are output to a signal processing circuit such as a digital signal processor (DSP).

The core amplifier 10 converts the input differential current signals received at the input terminals InP and InN into voltage signals and outputs the voltage signals to the VGA 20. For example, the gain of the core amplifier 10 changes in accordance with a control signal CNTL1 received from the AGC circuit 50. Here, the gain of the core amplifier 10 is expressed in units of impedance, such as 1000Ω, because a current is converted to a voltage. The core amplifier 10 includes, for example, an inverting amplifier (INV) 11 and resistor circuits R11 and R12. For example, the INV 11 is an example of an inverting amplifier circuit that amplifies the differential signals. The core amplifier 10 is an example of an amplifier circuit.

The INV 11, for example, inverts and amplifies the differential voltage signals input between a non-inverting input terminal and an inverting input terminal, and outputs the differential voltage signals inverted and amplified from a non-inverting output terminal and an inverting output terminal. The resistor circuit R11 is connected, for example, between the non-inverting input terminal of the INV 11 and the inverting output terminal of the INV 11. The resistor circuit R12 is connected, for example, between the inverting input terminal of INV 11 and the non-inverting output terminal of INV 11. The gain of the core amplifier 10 is varied in accordance with the control signal CNTL1. Here, the gain of the core amplifier 10 may be varied by using a variable resistor circuit for the resistor circuits R11 and R12 and changing the resistance values of the resistor circuits R11 and R12 in accordance with the control signal CNTL1.

The VGA 20 amplifies the differential voltage signals received from the core amplifier 10 and outputs the amplified voltage signals to the BUF 30. For example, the gain of the VGA 20 changes in accordance with control signals CNTL2, CNTL3, and CNTL4 received from the AGC circuit 50. The VGA 20 performs non-inverting amplification, for example, but may perform inverting amplification to invert the logic of the output differential voltage signals. The differential voltage signals consist of a non-inverted signal (a non-inverted component) and an inverted signal (an inverted component). The non-inverted signal and the inverted signal differ in phase by 180 degrees and form a pair of complementary signals.

For example, when the voltage of the non-inverted signal increases, the voltage of the inverted signal decreases, and when the voltage of the non-inverted signal decreases, the voltage of the inverted signal increases. When the non-inverted signal reaches the peak value, the inverted signal reaches the bottom value, and when the non-inverted signal reaches the bottom value, the inverted signal reaches the peak value. Preferably, the non-inverted signal and the inverted signal have the same amplitude and the same mean value (a DC component). The logic of the differential voltage signals can be inverted by switching between the pair of the non-inverted signal and the inverted signal. Thus, in a circuit that amplifies the differential voltage signals, a switch between non-inverting amplification and inverting amplification can be easily made by reconnecting the wiring of the non-inverted signal and the wiring of the inverted signal. Here, the VGA 20 may be included in the core amplifier 10 to amplify the differential voltage signals output from the core amplifier 10.

The BUF 30 outputs, to the AGC circuit 50, voltage signals IP and IN obtained by amplifying the differential voltage signals received from the VGA 20 and the CML 40. The CML 40 outputs voltage signals obtained by amplifying the voltage signals IP and IN to the output terminals OutP and OutN. The voltage signals IP and IN and the voltage signals output to the output terminals OutP and OutN are differential voltage signals. For example, the voltage signal IP is a non-inverted signal of the differential voltage signals and the voltage signal IN is an inverted signal of the differential voltage signals. Here, for example, when the voltage gain of the VGA 20 is sufficiently large and the drive capability is also sufficiently large, the BUF 30 may be omitted and the VGA 20 may supply the differential voltage signals IP and IN.

The AGC circuit 50 generates the control signals CNTL1 to CNTL4 that adjust the gain of the core amplifier 10 and the gain of the VGA 20 to set the amplitude of the differential voltage signals IP and IN received from the BUF 30, to the amplitude indicated by an output amplitude setting signal OA. The AGC circuit 50 is an example of a gain control circuit. An example of the AGC circuit 50 is illustrated in FIG. 2. The AGC circuit 50 controls the amplitude of the differential voltage signals IP and IN. For example, when the CML 40 performs linear amplification with constant gain, the amplitude of the differential voltage signals IP and IN is controlled at a constant amplitude, so that the amplitude of the differential voltage signals output from the output terminals OutP and OutN can be maintained at a constant amplitude.

<Circuit Configuration of the AGC Circuit>

FIG. 2 is a circuit diagram illustrating an example of the AGC circuit 50 of FIG. 1. The AGC circuit 50 includes bipolar transistors Q1P and Q1N that receive the differential voltage signals IP and IN output from the BUF 30 of FIG. 1. For example, the bipolar transistor Q1P receives the non-inverted voltage signal IP of the differential voltage signals IP and IN, and the bipolar transistor Q1N receives the inverted voltage signal IN of the differential voltage signals IP and IN. Additionally, the AGC circuit 50 includes a current source 151 and a resistor circuit R51 that are connected to emitters of the bipolar transistors Q1P and Q1N, and a capacitor circuit C51 that is connected to the resistor circuit R51. The bipolar transistors Q1P and Q1N have the same electrical characteristics within acceptable manufacturing variation, for example.

In the following, the bipolar transistor is also simply referred to as the transistor. The transistors Q1P and Q1N, the current source 151, the resistor circuit R51, and the capacitor circuit C51 constitute a detection circuit 57 that detects the amplitude of the voltage signals IP and IN. The detection circuit 57 generates an amplitude detection signal PH in accordance with the detected amplitude of the voltage signals IP and IN. For example, as the amplitude of the voltage signals IP and IN increases, the voltage value of the amplitude detection signal PH increases. The amplitude detection signal PH is output to a gate of a p-channel MOS transistor M1P of a differential amplifier circuit 56. The resistor circuit R51 and the capacitor circuit C51 constitute a low pass filter, and the amplitude detection signal PH is averaged and output from a connection node between the resistor circuit R51 and the capacitor circuit C51. For example, when the amplitude of the differential voltage signals IP and IN is constant, the amplitude detection signal PH becomes a DC signal having a voltage value corresponding to the magnitude of the amplitude. Hereinafter, the p-channel MOS transistor is simply referred to as the transistor.

Additionally, the AGC circuit 50 includes a bipolar transistor Q2 that receives a reference voltage Vref, a current source 152 and a resistor circuit R52 that are connected to an emitter of the transistor Q2, and a capacitor circuit C52. The transistor Q2, the current source 152, the resistor circuit R52, and the capacitor circuit C52 constitute a setting circuit 58. The setting circuit 58 generates an amplitude reference signal AH in accordance with the reference voltage Vref. The setting circuit 58 has a circuit configuration substantially the same as that of the detection circuit 57 that detects the amplitude of the voltage signals IP and IN, except that there is only one transistor to which the signal is input, and the electrical characteristics and sizes of respective circuit elements of the detection circuit 58 are substantially the same as the electrical characteristics and sizes of corresponding circuit elements of the detection circuit 57 within the allowable manufacturing variation, for example.

For example, the reference voltage Vref is set to the center voltage of the amplitude of the differential voltage signals IP and IN. The center voltage of the amplitude of the differential voltage signals IP and IN is equal to a temporal mean value (a DC component) of the respective voltage signals. Here, the reference voltage Vref may be a mean value obtained by resistor division in response to the voltage signals IP and IN output from the BUF 30 of FIG. 1 being provided to a series resistor circuit. For example, the voltage signal IP is provided at one end of the series resistor circuit consisting of two resistor circuits, the voltage signal IN is provided at the other end of the series resistor circuit, and a voltage at an intermediate point in the two connected resistors may be used as the reference voltage Vref.

The transistor Q2, the current source 152, the resistor circuit R52, and the capacitor circuit C52 function as the setting circuit 58 that performs level conversion of the reference voltage Vref and generates the level-converted voltage as an amplitude reference signal AH. The amplitude reference signal AH is output to a gate of a p-channel MOS transistor MIN of the differential amplifier circuit 56. The resistor circuit R52 and the capacitor circuit C52 constitute a low pass filter, and the level-converted reference voltage Vref is stabilized and output from a connection node between the resistor circuit R52 and the capacitor circuit C52. For example, the amplitude reference signal AH is a DC signal having a voltage value corresponding to the reference voltage Vref. As described, the amplitude detection signal PH and the amplitude reference signal AH are output to the differential amplifier circuit as DC signals. For example, the transistors Q1P, Q1N, and Q2 are heterojunction bipolar transistors.

The differential amplifier circuit 56 includes, for example, the transistors M1P and M1N, a current source 153 that is connected to a source of the transistors M1P and M1N, and resistor circuits R53, R54, R55 and R56. The resistor circuits R53 and R54 are connected in series between a drain of the transistor M1P and a grounding line GND. The resistor circuits R55 and R56 are connected in series between a drain of the transistor M1N and a grounding line GND. For example, the resistance values of the resistor circuits R53 and R55 are identical to each other within acceptable manufacturing variation, and the resistance values of the resistor circuits R54 and R56 are identical to each other within acceptable manufacturing variation. The transistors M1P and M1N have the same electrical characteristics within acceptable manufacturing variation, for example.

A connection node OFS to which the resistor circuits R53 and R54 are interconnected receives an offset current Ioffset from a digital-to-analog converter (DAC) 52. This adds an offset voltage corresponding to the product of a value of the offset current Ioffset and the resistance value of the resistor circuit R54 to the drain voltage of the transistor M1P with respect to the ground potential.

The DAC 52 generates the offset current Ioffset corresponding to a digital value of an output amplitude setting signal OA. For example, as the digital value of the output amplitude setting signal OA increases, the current value of the offset current Ioffset increases. As the current value of the offset current Ioffset increases, the voltage of the above-described offset voltage increases. The output amplitude setting signal OA is provided, for example, from outside of the transimpedance amplifier circuit 100. The DAC 52 is an example of a current generator that generates the offset current Ioffset corresponding to the digital value indicated by the output amplitude setting signal OA.

For example, the digital value of the output amplitude setting signal OA is set to a small value when the set amplitude is small and is set to a large value when the set amplitude is large. Here, FIG. 2 indicates an example of two digits in binary (A[1:0]) to represent a digital value A of the output amplitude setting signal OA. However, it is sufficient that the digital value A is one digit or greater in binary.

For example, when the set amplitude is relatively small, the DAC 52 receives the output amplitude setting signal OA having a relatively small value and outputs the offset current Ioffset having a relatively small value. This causes the above-described offset voltage to be set to a relatively small value. When the set amplitude is relatively large, the DAC 52 receives the output amplitude setting signal OA having a relatively large value and outputs the offset current Ioffset having a relatively large value. This causes the above-described offset voltage to be set to a relatively large value. The DAC 52 is, for example, a current DAC (IDAC) that outputs a current. The current DAC is a circuit that generates an analog current in accordance with an input digital value. The offset current Ioffset input from the current DAC sets the offset voltage at the differential amplifier circuit 56.

The differential amplifier circuit 56 outputs differential voltage signals VIN and VIP generated in accordance with the voltage of the amplitude detection signal PH and the voltage of the amplitude reference signal AH; and the offset voltage set by the offset current Ioffset from the drain of the transistor M1P and the drain of the transistor M1N. The differential amplifier circuit 56 and the DAC 52 are an example of a differential voltage generation circuit that generates differential voltage signals by correcting a difference between the voltage of the amplitude detection signal and the voltage of the amplitude reference signal in accordance with the output amplitude setting signal OA. The correction in accordance with the output amplitude setting signal OA is performed by adding the offset voltage corresponding to the product of the value of the offset current Ioffset and the resistance value of the resistor circuit R54 to the voltage of one of the generated differential signals (e.g., VIN), as described above, for example.

The differential voltage signals VIP and VIN are supplied to differential inputs of an operational transconductance amplifier (OTA) 51. The differential voltage signals VIP and VIN are supplied to the OTA 51, so that the signal to noise (SN) ratio can be improved and thus the accuracy of the output amplitude control of the AGC can be improved, in comparison with the case where the amplitude detection signal PH and the amplitude reference signal AH are supplied directly to the OTA 51. Additionally, by adding the offset voltage of the above-described offset current Ioffset to the voltage signal VIN (the inverted signal), which is one of the differential voltage signals VIP and VIN, the amplitude of the differential voltage signals IP and IN can be set to be equal to the amplitude value set by the output amplitude setting signal OA without further adding a circuit, when the voltage value of the voltage signal VIP is equal to the voltage value of the voltage signal VIN.

The OTA 51 outputs a differential current signal from an output node in accordance with the differential voltage signals VIN and VIP. The OTA 51 is an example of a voltage control current source circuit. For example, the OTA 51 outputs a current (a differential current signal) in accordance with a difference voltage between the voltage of the voltage signal VIP and the voltage of the voltage signal VIN. For example, as the voltage value of the voltage signal VIP increases above the voltage value of the voltage signal VIN, the difference current signal decreases, and as the voltage value of the voltage signal VIP decreases below the voltage value of the voltage signal VIN, the difference current signal increases. For example, when the voltage value of the voltage signal VIP is equal to the voltage value of the voltage signal VIN, the differential current signal is zero. A capacitor circuit C2,1 is connected to the output node of the OTA 51, and capacitor circuits C2,2 ... C2,n (n is an integer greater than or equal to 2) are connected to the output node of the OTA 51 via respective switches SW. The n capacitor circuits C2,1, C2,2, ..., C2,n are connected in parallel to each other when all n−1 switches are turned on. Hereinafter, the capacitor circuits C2,1, C2,2 ..., C2,n are referred to as capacitor circuits C2 when the capacitor circuits C2,1, C2,2 ..., C2,n are described without distinction. Here, the capacitor circuits C2 may be provided within the OTA 51.

The OTA 51 functions as an integration circuit together with the capacitor circuits C2 connected to the output of the OTA 51 to generate a voltage at the output node in accordance with the differential current signal output from the OTA 51 and the capacitance value of the capacitor circuit C2. The time constant due to the output impedance of the OTA 51 and the capacitor circuit C2 forms a dominant pole of the gain characteristics of the AGC loop. Hereinafter, the symbols C2,1, C2,2, ..., and C2,n are also used as capacitance values of the capacitor circuits C2,1, C2,2, ..., and C2,n, respectively. Here, the AGC loop according to the first embodiment includes the core amplifier 10 that varies the gain in accordance with the control signal CNTL1, the VGA 20 that varies the gain in accordance with the control signals CNTL2 to CNTL4, the BUF 30, and the AGC circuit 50 that generates the control signals CNTL1 to CNTL4 in response to the differential voltage signals IP and IN being input.

The switching (on and off) of each switch SW is controlled by the thermometer code generator 53. The thermometer code generator 53 outputs an output signal X[2:0] that is a thermometer code, in accordance with the digital value A[1:0] of the output amplitude setting signal OA as illustrated in the truth table in the drawing. This can increase the number of capacitor circuits C2 connected to the output node of the OTA 51 one by one, each time the logical value of the output amplitude setting signal OA increases. Therefore, the capacitance value of the output node of the OTA 51 can be easily set according to the logical value of the output amplitude setting signal OA.

More specifically, when the number of digits of the digital value A in binary is m (where m is an integer greater than or equal to two), the number of the output signals X that corresponds to the digital value A[m−1:0] is $2^m-1$. In the thermometer code, as the digital value A increases by one, the number of the switches SW that is turned on increases by one. Therefore, when the digital value A is incremented or decremented by 1, only one switch SW is turned on or off accordingly, and the capacitance value of the capacitor circuit C2 can be monotonously incremented or decremented without being influenced by the timing of the output signal X. For example, when two switch SWs are controlled simultaneously without using the thermometer code, specifically, when one switch SW is turned on from the OFF state and the other switch SW is turned off from the ON state, there is a possibility that the monotonic change of the changed voltage of the capacitor circuits C2 is not guaranteed due to the shift between the timings of the respective output signals X. This may cause the control signals CNTL1 to CNTL4 to be inappropriately generated.

The multiple switches SW and the multiple capacitor circuits C2 are examples of a variable capacitor circuit that is charged and discharged by the differential current signal. The output signal X[2:0] is an example of a switch control signal that controls the switch SW, and the thermometer code generator 53 is an example of a switch controller that generates the output signal X[2:0] in accordance with the output amplitude setting signal OA.

Figure 4:
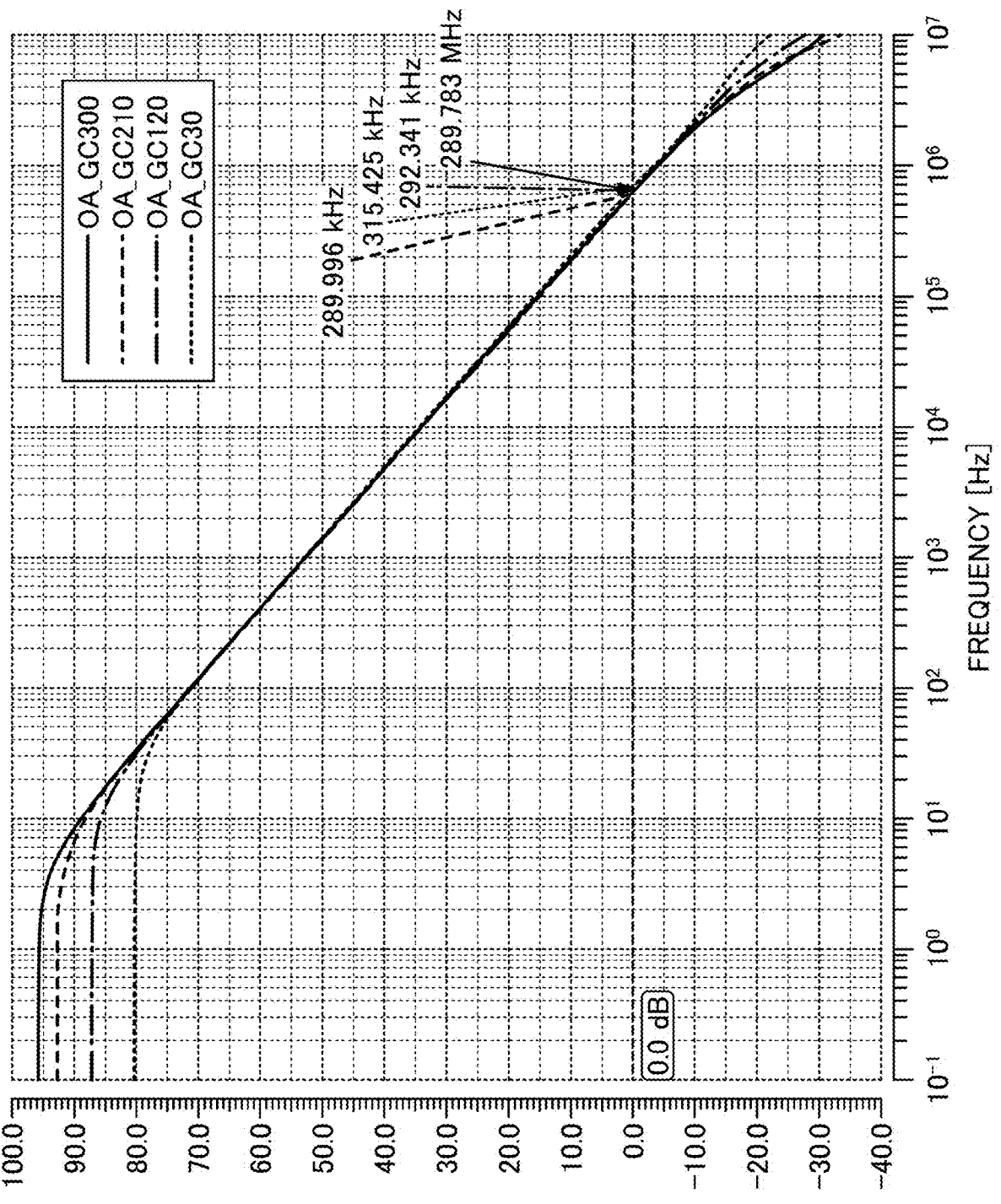
FIG. 4 is a characteristic graph indicating an example of an AGC loop gain in accordance with an amplitude set by an output amplitude setting signal in the AGC circuit of FIG. 2.

The capacitance value of the capacitor circuit C2 is set to compensate for the change of the AGC band due to the amplitude setting indicated by the output amplitude setting signal OA. Therefore, as indicated in FIG. 4, which will be described later, the AGC band of the AGC circuit 50 can be maintained constant regardless of the setting of the output amplitude setting signal OA.

A gain controller 54 is connected to the output of the OTA 51. The gain controller 54 generates the control signals CNTL1 to CNTL4 that control the gain of the core amplifier 10 and the VGA 20 in accordance with the charging voltage of the capacitor circuit C2 connected to the output node of the OTA 51. Because the output node of the OTA 51 discharges the capacitor circuit C2, the output node outputs the charging voltage of the capacitor circuit C2.

For example, the gain controller 54 generates the control signals CNTL1 to CNTL4 that increase the gain of the core amplifier 10 and the VGA 20 when the voltage of the output node of the OTA 51 is relatively low. The gain controller 54 generates the control signals CNTL1 to CNTL4 that reduce the gain of the core amplifier 10 and the VGA 20 when the voltage of the output node of the OTA 51 is relatively high.

When the amplitude detection signal PH and the amplitude reference signal AH are constant, the voltage value of the voltage signal VIN decreases as the offset current Ioffset decreases, and the voltage value of the voltage signal VIN increases as the offset current Ioffset increases. The transimpedance amplifier circuit 100 operates to cause the difference between the voltage value of the voltage signal VIP and the voltage value of the voltage signal VIN that are input to the OTA 51 to be "0" by the negative feedback of the AGC loop described above and to cancel the offset voltage caused by the offset current Ioffset. As a result, the AGC circuit 50 that can set the amplitude with the digital value of the output amplitude setting signal OA can be configured.

[Example of Setting Capacitance Value]

Figure 3:
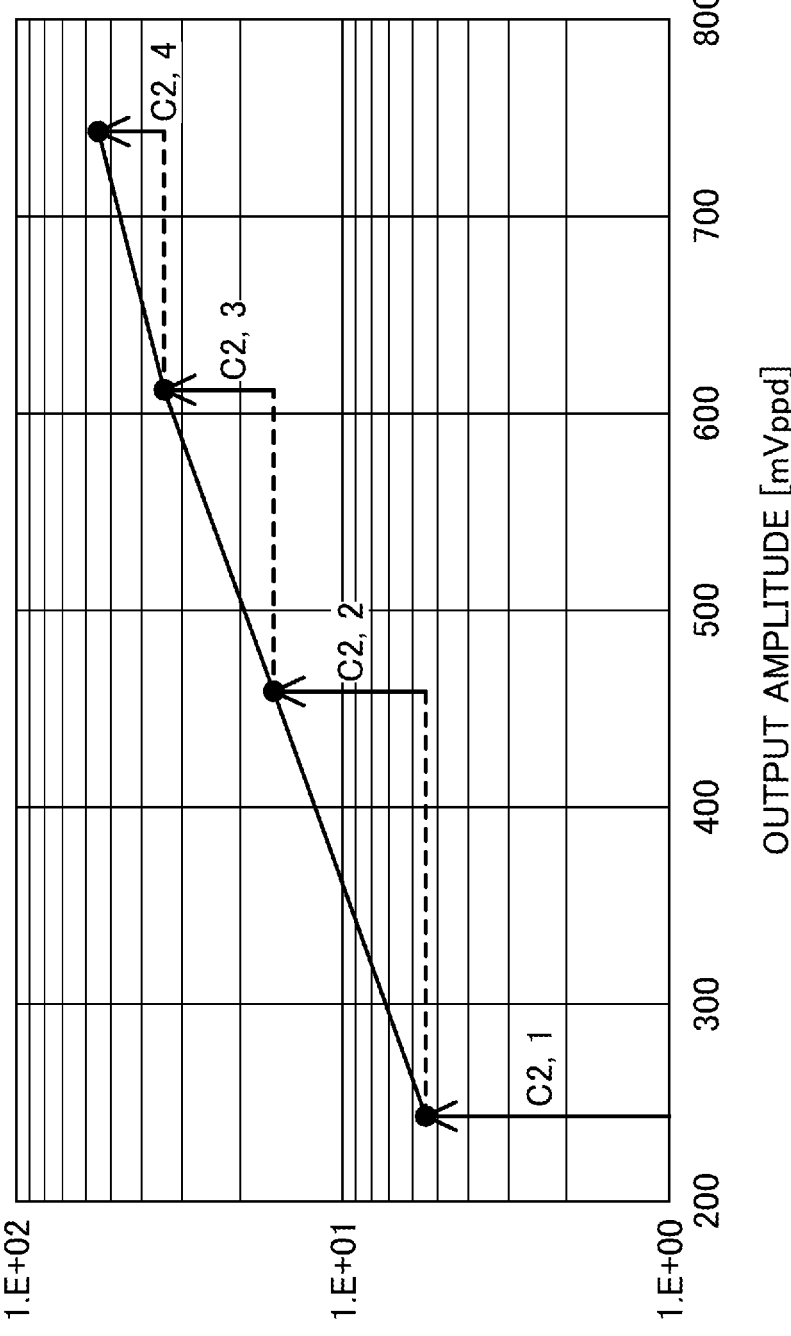
FIG. 3 is a graph depicting an example of a capacitance value set by a thermometer code generator of FIG. 2.
Figure 14:
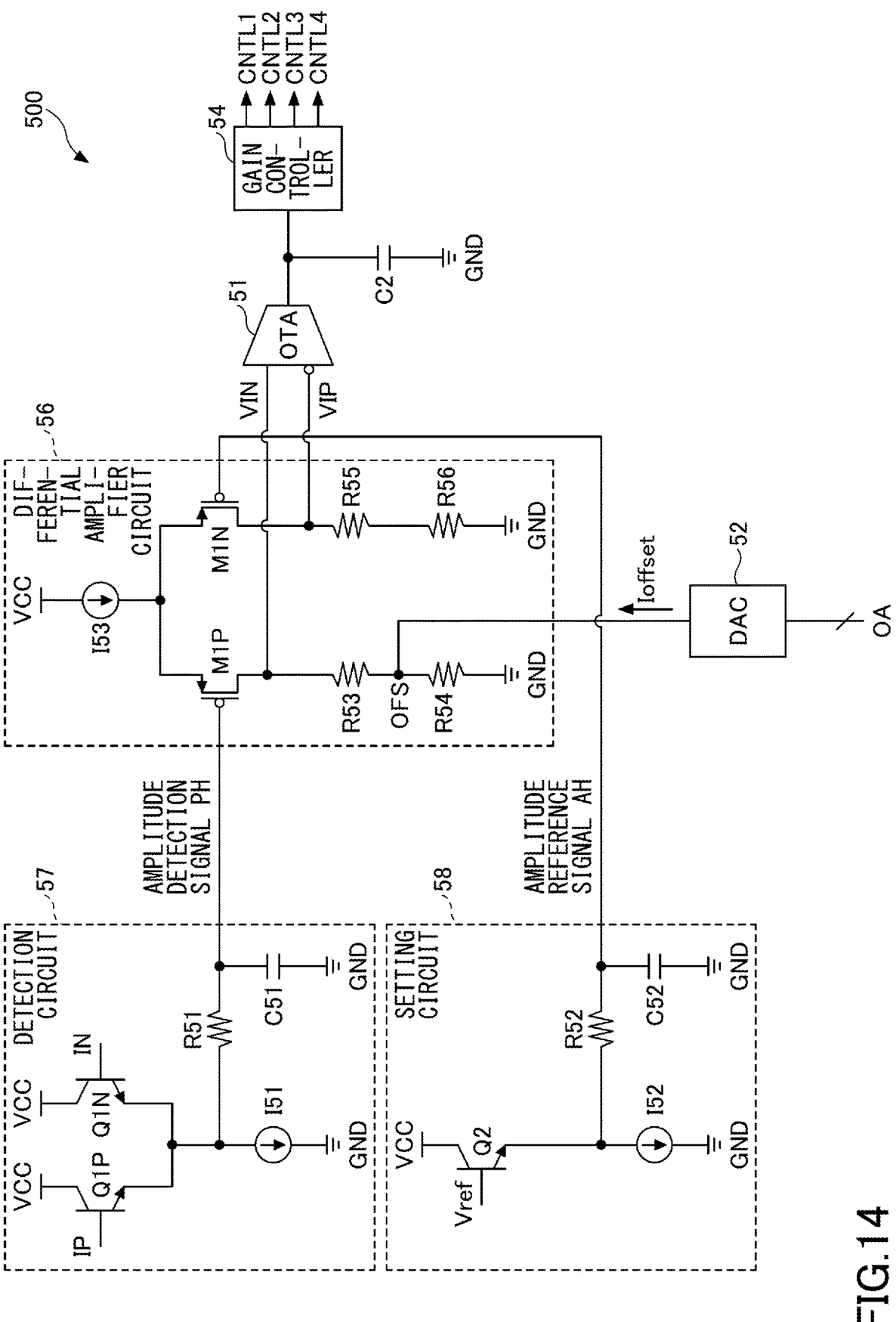
FIG. 14 is a circuit diagram illustrating another configuration example of the AGC circuit mounted on the transimpedance amplifier circuit of FIG. 1 or FIG. 6.
Figure 16:
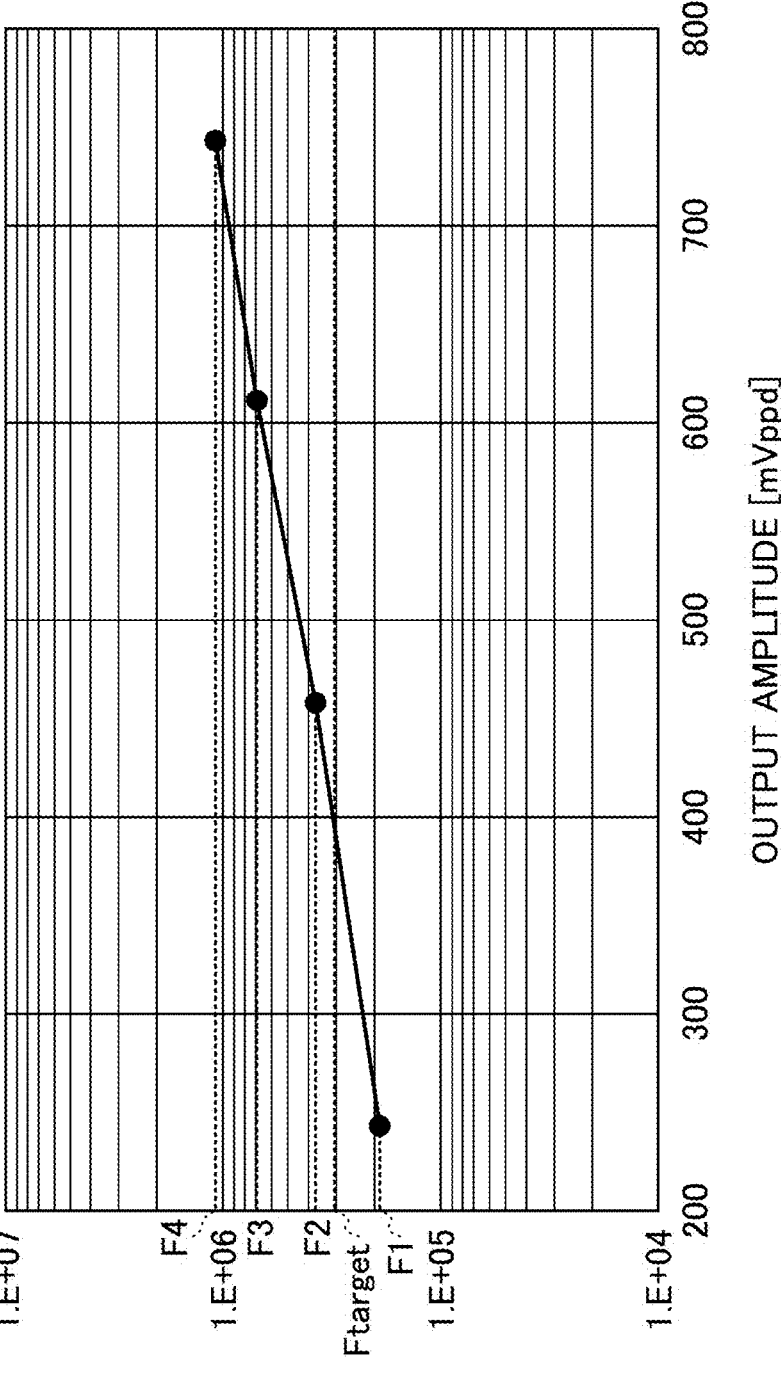
FIG. 16 is a characteristic graph indicating the characteristics indicated in FIG. 15 as an AGC band with respect to an output amplitude.

FIG. 3 is a graph depicting an example of setting a capacitance value of the capacitor circuit C2 by the thermometer code generator 53 of FIG. 2. For example, as illustrated in FIG. 14, which will be described below, when the capacitor circuit C2 having a fixed capacitance value is connected to the output node of the OTA 51, a relation between the output amplitude of the differential voltage signals output from the output terminals OutP and OutN and the AGC band are indicated in FIG. 16. It is considered that the values of the four points in the AGC bands in FIG. 16 are F1, F2, F3, and F4 from the smaller, respectively, and the four points F1 to F4 are adjusted to be a constant band Ftarget regardless of the setting of the output amplitude. For example, the band Ftarget is 300 kHz. Hereinafter, the circuit of FIG. 14 is referred to as a non-compensated circuit and the circuit of FIG. 2 is referred to as a compensated circuit.

Assuming that the parasitic capacitance at the output node of the OTA 51 is Cp (e.g., 5 pF) and the capacitance value of the capacitor circuit C2 of the non-compensated circuit (FIG. 14) is C2F (e.g., 12 pF), the capacitance value of the non-compensated circuit is constant (Cp+C2F). Here, the parasitic capacitance Cp is the sum of the output capacitance of the output node of the OTA 51, the input capacitance of the gain controller 54, the capacitance of the wiring connecting the OTA 51 and the gain controller 54, and the like. The parasitic capacitance Cp is a fixed value depending on an embodiment.

The AGC band increases as the set output amplitude increases, as indicated in FIG. 16. Therefore, in order to achieve a constant AGC band, as the set amplitude increases, it is necessary to increase the capacitance value of the capacitor circuit C2 and lower the AGC band. The capacitance value of the capacitor circuit C2 and the AGC band are inversely proportional, and the parasitic capacitance Cp remains unchanged between the non-compensated circuit and the compensated circuit.

Therefore, the capacitance value Cn (n is a positive integer) determined by each output amplitude setting of the compensated circuit can be obtained by Eq. (1).

$$Cn=(C2F+Cp) \cdot Fn/F\text{target}-Cp \qquad (1)$$

In Eq. (1), when the value of the AGC band Fn is equal to the constant band Ftarget, Cn=C2F. Additionally, when the value of AGC band Fn is greater than the constant band Ftarget, Cn is greater than C2F, and when the value of AGC band Fn is less than the constant band Ftarget, Cn is less than C2F.

FIG. 3 indicates Cn calculated using Eq. (1). The four points in FIG. 3 respectively correspond to the four points in FIG. 16. When n is greater than 2, the compensated capacitance value Cn is a value obtained by adding the capacitance values $C2,n$ to the capacitance value C(n−1), which is a value of a previous amplitude setting, as indicated below.

$$C2,1=C1$$

$$C2,2=C2-C2,1=C2-C1$$

$$C2,3=C3-(C2,1+C2,2)=C3-C2$$

$$\cdots$$

$$C2,n=Cn-(C2,1+\ldots+C2,(n-1))=Cn-C(n-1)$$

[Loop Gain of the First Embodiment]

FIG. 4 is a characteristic graph indicating an example of the loop gain of the AGC loop in accordance with the amplitude setting set by the output amplitude setting signal OA in the AGC circuit 50 of FIG. 2. FIG. 4 indicates the frequency characteristics of the AGC loop gain when the optical input signal power is constant (e.g., −15 dBm).

The numerical values at the end of the symbols OA_GC30, OA_GC120, OA_GC210, and OA_GC300 indicated in FIG. 4 correspond to the magnitudes of the set amplitude. As the numerical value increases, the output amplitude setting signal OA having a larger value is supplied to the DAC 52 and the thermometer code generator 53.

The AGC band can be obtained as the frequency at which the gain is "1" (0 dB in decibels) in the frequency characteristic of the loop gain of the AGC loop, as described above. For example, the proper range of the AGC band is 100 kHz to 1 MHz. In this embodiment, by changing the capacitance value of the capacitor circuit C2 connected to the output node of the OTA 51 in accordance with the amplitude setting, the AGC band can be set to about 300 kHz regardless of the output amplitude setting. 300 kHz is located near the center of the proper range of the AGC band, and the desired communication performance can be obtained even when the optical input signal power changes.

Figure 5:
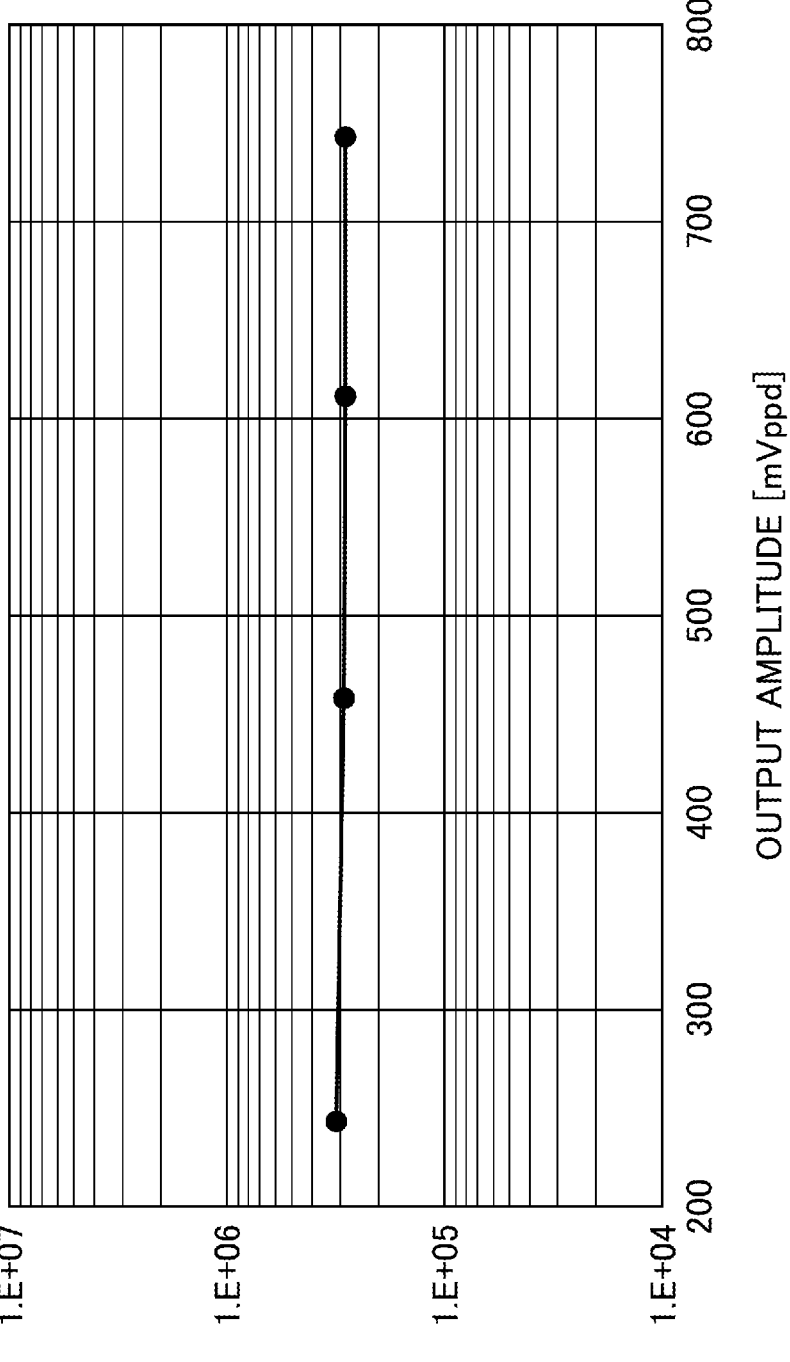
FIG. 5 is a characteristic graph indicating the characteristics illustrated in FIG. 4 as an AGC band with respect to an output amplitude.

FIG. 5 is a characteristic graph indicating the characteristics indicated in FIG. 4 as the AGC band with respect to the output amplitude. As indicated in FIG. 5, the AGC band can be substantially constant regardless of the amplitude set by the output amplitude setting signal OA.

As described above, in this embodiment, by changing the capacitance value of the capacitor circuit C2 connected to the output node of the OTA 51 in accordance with the amplitude setting, the AGC band can be constant regardless of the magnitude of the output amplitude to be set. That is, the transimpedance amplifier circuit 100 that suppresses the change in the AGC band due to amplitude setting can be provided. As a result, sufficient communication performance can be obtained even when the optical input signal power changes.

By connecting the capacitor circuit C2 to the output node of the OTA 51 via the switch SW switched in response to the output amplitude setting signal OA, the charge stored in the capacitor circuit C2 can be changed in accordance with the set amplitude. This compensates for the change in the AGC band due to the amplitude setting. By generating the output signal X[2:0] representing the thermometer code corresponding to the output amplitude setting signal OA, the capacitance value corresponding to the output amplitude setting signal OA can be stably set to the output of the OTA 51 without being affected by the timing of the ON/OFF of the output signal X[2:0].

By supplying the offset current Ioffset to the connection node OFS between the resistor circuits R53 and R54 of the differential amplifier circuit, the offset voltage corresponding to the amplitude indicated by the output amplitude setting signal OA can be easily reflected in the output of the differential amplifier circuit without adding a circuit. As a result, the amplitude of the differential voltage signals IP and IN can be set to the amplitude indicated by the output amplitude setting signal OA.

Second Embodiment

[Circuit Configuration of a Transimpedance Amplification]

Figure 6:
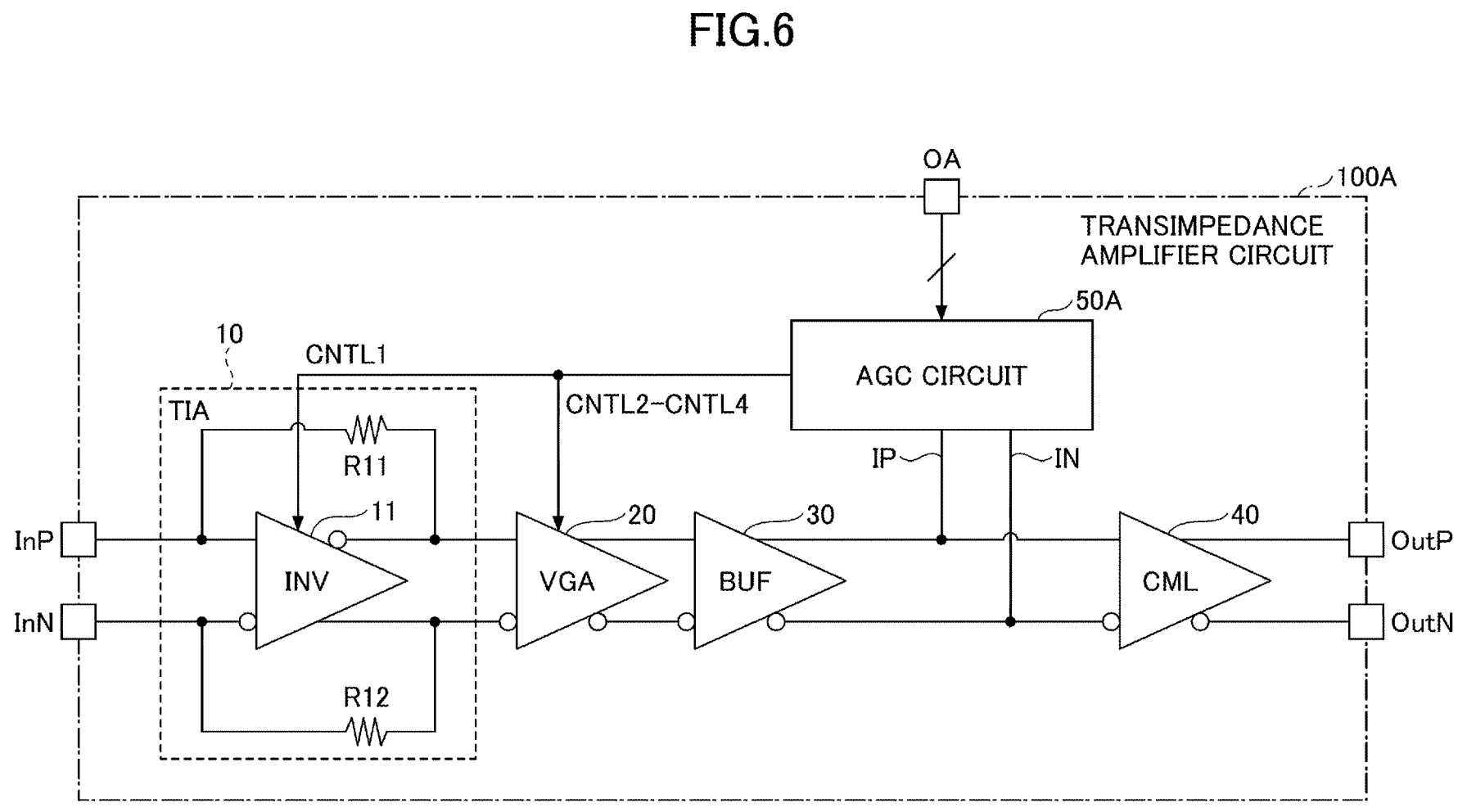

FIG. 6 is a block diagram illustrating an example of a configuration of a transimpedance amplifier circuit according to a second embodiment. A transimpedance amplifier circuit 100A illustrated in FIG. 6 differs from the transimpedance amplifier circuit 100 illustrated in FIG. 1 in that an AGC circuit 50A is used instead of the AGC circuit 50.

Figure 7:
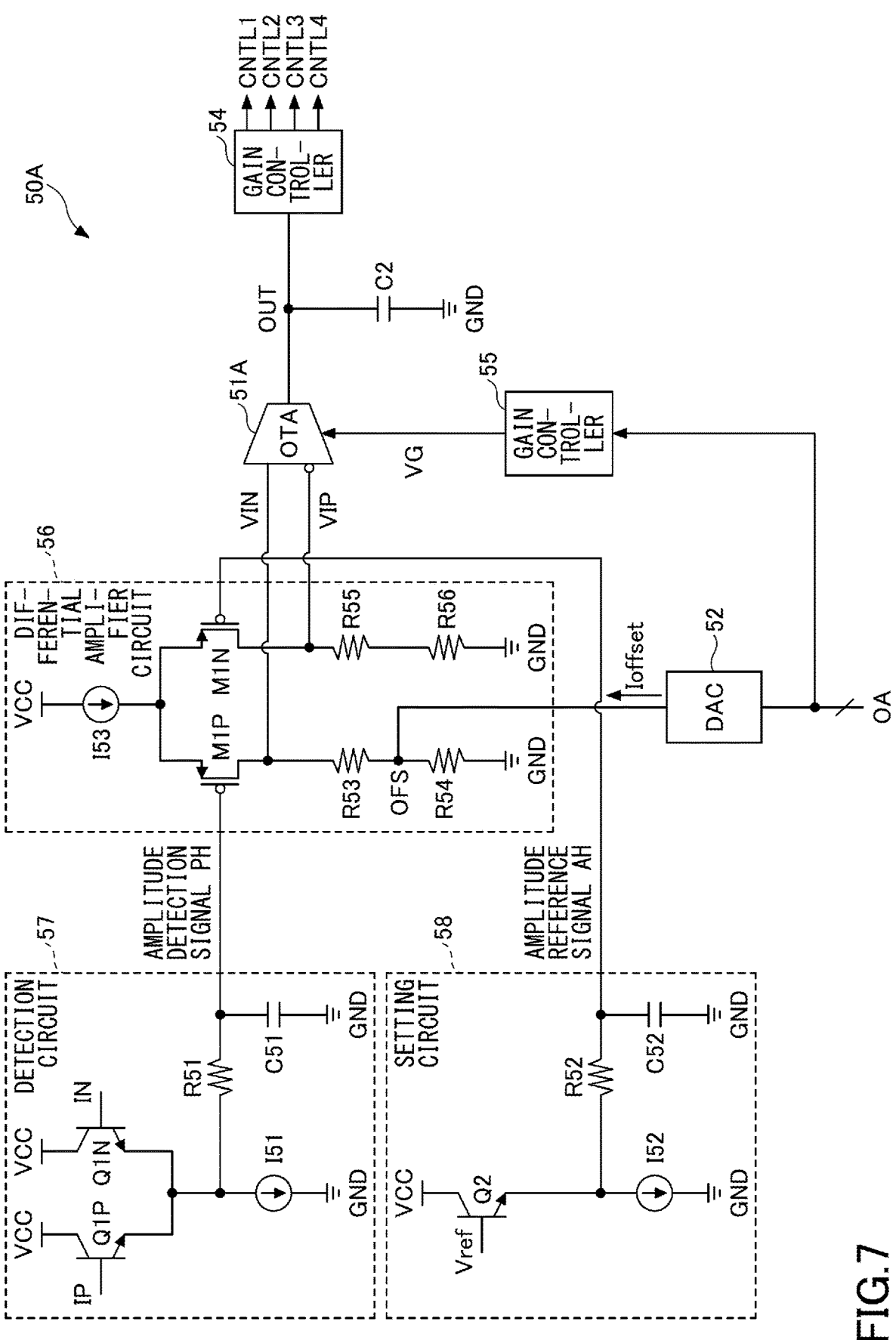
FIG. 7 is a circuit diagram illustrating an example of the AGC circuit of FIG. 6.

The AGC circuit 50A generates the control signals CNTL1 to CNTL4 that adjust the gain of the core amplifier 10 and the VGA 20 in order to set the amplitude of the differential voltage signals output from the output terminals OutP and OutN to the amplitude indicated by the output amplitude setting signal OA. The gain of the core amplifier 10 and the VGA 20 set by the control signals CNTL1 to CNTL4 is an example of a first gain. The AGC circuit 50A is an example of a gain control circuit. An example of the AGC circuit 50A is illustrated in FIG. 7. The AGC circuit 50A detects the amplitude of the differential voltage signals IP and IN. For example, when the CML 40 performs linear amplification with a constant gain, the amplitude of the differential voltage signals output from the output terminals OutP and OutN changes linearly with respect to the amplitude of the differential voltage signals IP and IN. Therefore, the output amplitude of the differential voltage signals output from the output terminals OutP and OutN can be set to a predetermined value by controlling the amplitude of the differential voltage signals IP and IN.

[Circuit Configuration of the AGC Circuit]

FIG. 7 is a circuit diagram illustrating an example of the AGC circuit 50A in FIG. 6. The AGC circuit 50A includes the bipolar transistors Q1P and Q1N that receive the differential voltage signals IP and IN output from the BUF 30 of FIG. 6. For example, the bipolar transistor Q1P receives the non-inverted voltage signal IP of the differential voltage signals IP and IN, and the bipolar transistor Q1N receives the inverted voltage signal IN of the differential voltage signals IP and IN. Additionally, the AGC circuit 50A includes the current source 151 and the resistor circuit R51 that are connected to the emitters of the bipolar transistors Q1P and Q1N, and the capacitor circuit C51 that is connected to the resistor circuit R51. The bipolar transistors Q1P and Q1N have the same electrical characteristics, for example, within acceptable manufacturing variation.

The AGC circuit 50A includes the detection circuit 57. The detection circuit 57 generates the amplitude detection signal PH in accordance with the amplitude of the input voltage signals IP and IN. This detection circuit 57 is, for example, the same as the detection circuit 57 of the AGC circuit 50 illustrated in FIG. 2. Therefore, the detailed description is omitted here.

Additionally, the AGC circuit 50A includes the setting circuit 58. The setting circuit 58 generates the amplitude reference signal AH in accordance with the reference voltage Vref. This setting circuit 58 is, for example, the same as the setting circuit 58 of the AGC circuit 50 illustrated in FIG. 2. Therefore, the detailed description is omitted here.

The reference voltage Vref is set to the center voltage of the amplitude of the differential voltage signals IP and IN, for example. The center voltage of the amplitude of the differential voltage signals IP and IN is equal to the temporal mean value (the DC component) of the respective voltage signals. Here, the reference voltage Vref may be a mean value obtained by resistor division in response to the voltage signals IP and IN output from the BUF 30 of FIG. 6 being provided to a series resistor circuit. For example, the voltage signal IP is provided at one end of the series resistor circuit consisting of two resistor circuits, the voltage signal IN is provided at the other end of the series resistor circuit, and a voltage at an intermediate point in the two connected resistor circuits may be used as the reference voltage Vref.

The AGC circuit 50A further includes the differential amplifier circuit 56. The differential amplifier circuit 56 receives the amplitude detection signal PH and the amplitude reference signal AH as differential signals. Additionally, the differential amplifier circuit 56 includes the connection node OFS to which the offset current Ioffset is input. The differential amplifier circuit 56 generates the differential voltage signals VIN and VIP in accordance with the voltage of the amplitude detection signal PH and the voltage of the amplitude reference signal AH; and the offset voltage set by the offset current Ioffset. This differential amplifier circuit 56 is, for example, the same as the differential amplifier circuit 56 of the AGC circuit 50 illustrated in FIG. 2. Therefore, the detailed description is omitted here.

The connection node OFS receives the offset current Ioffset from the digital-to-analog converter (DAC) 52. Therefore, the offset voltage corresponding to the offset current Ioffset is added to the voltage of the differential voltage signal VIN with respect to the ground potential.

The AGC circuit 50A further includes the DAC 52. The DAC 52 generates the offset current Ioffset corresponding to the digital value indicated by the output amplitude setting signal OA. This DAC 52 is, for example, the same as the DAC 52 of the AGC circuit 50 illustrated in FIG. 2. Therefore, the detailed description is omitted here.

The digital value of the output amplitude setting signal OA is set to a small value when the set amplitude is small, and is set to a large value when the set amplitude is large, for example. The output amplitude setting signal OA is also output to the gain controller 55.

For example, when the digital value of the output amplitude setting signal OA is relatively small, the DAC 52 generates the offset current Ioffset having a relatively small value, and the offset voltage of the differential amplifier circuit 56 is set to a relatively small value in accordance with the offset current Ioffset. This causes the amplitude of the output signal controlled by the AGC circuit 50A to be set to a relatively small value. Additionally, when the digital value of the output amplitude setting signal OA is relatively large, the DAC 52 generates the offset current Ioffset having a relatively large value, and the offset voltage of the differential amplifier circuit 56 is set to a relatively large value in accordance with the offset current Ioffset. This causes the amplitude of the output signal controlled by the AGC circuit 50A to be set to a relatively large value.

The gain controller 55 generates a gain control voltage VG in accordance with the digital value of the output amplitude setting signal OA. For example, when the digital value of the output amplitude setting signal OA is relatively small (when the set amplitude is small), the gain controller 55 outputs the gain control voltage VG having a relatively low value. When the digital value of the output amplitude setting signal OA is relatively large (when the set amplitude is large), the gain controller 55 outputs the gain control voltage VG having a relatively large value. The gain of an OTA 51A controlled by the gain control voltage VG is an example of a second gain. The OTA 51A will be described later.

The differential voltage signals VIP and VIN generated by the differential amplifier circuit 56 are supplied to differential inputs of the OTA 51A. By supplying the voltage signals VIP and VIN obtained by the amplification of the difference to the OTA 51A, the signal to noise (SN) ratio can be improved in comparison with the case where the amplitude detection signal PH and the amplitude reference signal AH are directly supplied to the OTA 51A, thereby improving the accuracy of the output amplitude control of AGC. Additionally, by adding the offset voltage of the above-described offset current Ioffset to the voltage signal VIN, which is one of the differential voltage signals VIP and VIN, the amplitude of the differential voltage signals IP and IN can set to be equal to the amplitude value set in accordance with the output amplitude setting signal OA without further adding a circuit, when the voltage value of the voltage signal VIP is equal to the voltage value of the voltage signal VIN.

Figure 8:
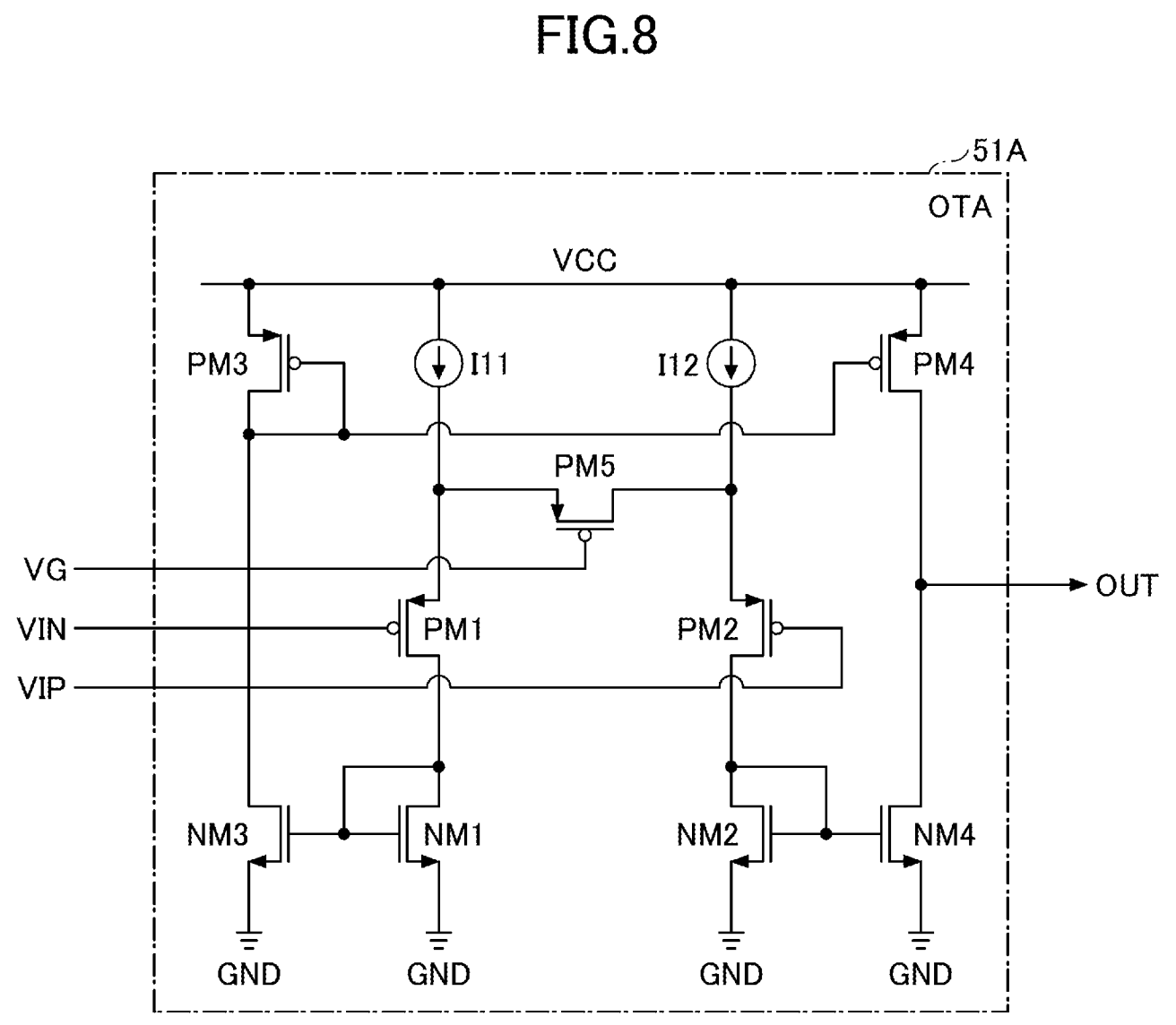

The OTA 51A receives the gain control voltage VG from the gain controller 55 and outputs the differential current signal OUT from the output node in accordance with the differential voltage signals VIP and VIN. The OTA 51A operates as a variable gain OTA in accordance with the gain control voltage VG and controls the gain in accordance with the value of the output amplitude setting signal OA. Because the OTA 51A outputs a current signal in accordance with an input voltage signal, the gain of the OTA 51A is represented in units of conductance, such as 100S. Adjustment of the gain of the OTA 51 compensates for the change in the AGC band due to the change in the output amplitude, so that the AGC band can be maintained constant regardless of the value of the output amplitude setting signal OA. A specific circuit example of the OTA 51A is illustrated in FIG. 8. The OTA 51 is an example of the voltage control current source circuit.

The capacitor circuit C2 is connected to the output node of the OTA 51A. The OTA 51A and the capacitor circuit C2 function as an integration circuit and generate the output voltage OUT at the output node in accordance with the differential current signal output from the OTA 51A and the capacitance value of the capacitor circuit C2. The time constant due to the output impedance of the OTA 51 and the capacitor circuit C2 forms a dominant pole of the gain characteristics of the AGC loop. Here, the AGC loop in the transimpedance amplifier circuit 100A includes the core amplifier 10 that changes the gain in accordance with the control signal CNTL1, the VGA 20 that changes the gain in accordance with the control signals CNTL2 to CNTL4, the BUF 30, and the AGC circuit 50A that generates the control signals CNTL1 to CNTL4 in response to the differential voltage signals IP and IN being input. Here, the capacitor circuit C2 may be provided within the OTA 51A.

The gain controller 54 is connected to the output of the OTA 51A. The gain controller 54 generates the control signals CNTL1 to CNTL4 that control the gain of the core amplifier 10 and the VGA 20 in accordance with the output voltage OUT that is the charging voltage of the capacitor circuit C2 connected to the output node of the OTA 51A. This gain controller 54 is, for example, the same as the gain controller 54 of the AGC circuit 50 illustrated in FIG. 2. Therefore, the detailed description is omitted here.

The gain of the OTA 51A is set in accordance with the gain control voltage VG that is set in accordance with the digital value of the output amplitude setting signal OA. With the gain being set, the OTA 51A operates in the same manner as the OTA 51 of the AGC circuit 50 illustrated in FIG. 2. That is, when the amplitude detection signal PH and the amplitude reference signal AH are constant, the voltage value of the voltage signal VIN decreases as the offset current Ioffset decreases, and the voltage value of the voltage signal VIN increases as the offset current Ioffset increases. The transimpedance amplifier circuit 100A operates so that the difference between the voltage signals VIN and VIP input to the OTA 51 is "0" and the offset voltage due to the offset current Ioffset is canceled, with the negative feedback of the AGC loop described above. As a result, the AGC circuit 50A that can set the amplitude with the digital value of the output amplitude setting signal OA can be configured by using the OTA 51 in which the gain is set by the digital value of the output amplitude setting signal OA. [Example Circuit of the OTA]

FIG. 8 is a circuit diagram illustrating an example of the OTA 51A in FIG. 7. The OTA 51A includes, for example, p-channel MOS transistors PM1, PM2, PM3, PM4, and PM5, re-channel MOS transistors NM1, NM2, NM3, and NM4, and current sources I11 and I12.

Gates of the transistors PM1 and PM2 receive the differential voltage signals VIN and VIP from the differential amplifier circuit 56 of FIG. 7. The current source I11 is connected to a source of the transistor PM1, and the current source I12 is connected to a source of the transistor PM2. Additionally, a source of the transistor PM5 is connected to the source of the transistor PM1. A drain of the transistor PM5 is connected to the source of the transistor PM2. A gate of the transistor PM5 receives the gain control voltage VG. Here, because the transistor PM5 functions as a variable resistor circuit as will be described later, the source and drain of the transistor PM5 may be switched. That is, the source of the transistor PM1 may be connected to the drain of the transistor PM5, and the source of the transistor PM2 may be connected to the source of the transistor PM5.

The drain of the transistor PM1 is connected to a common gate of a current mirror circuit formed by the transistors NM1 and NM3. The drain of the transistor PM2 is connected to a common gate of the current mirror circuit formed by the transistors NM2 and NM4. Further, the drain of the transistor NM3 is connected to a common gate of a current mirror circuit formed by the transistors PM3 and PM4. The drain of the transistor PM4 and the drain of the transistor NM4 are connected to the output terminal OUT of the OTA 51A.

A gate of the transistor PM1 receives, for example, one signal of the differential voltage signals VIP and VIN (the inverted signal VIN). A gate of the transistor PM2 receives, for example, the other signal of the differential voltage signals VIP and VIN (the non-inverted signal VIP). The transistors PM1 and PM2 generate a differential output current signal in accordance with the differential voltage signals VIP and VIN. For example, the drain current of the transistor PM1 flows through the transistor NM1 and the drain current of the transistor PM2 flows through the transistor NM2. In accordance with the difference voltage between the voltage signal VIP and the voltage signal VIN, the difference current between the drain current of the transistor NM1 and the drain current of the transistor NM2 changes.

One signal of the differential output current signals flowing through the transistor NM1 is supplied to the output terminal OUT via a two-stage current mirror circuit including the transistors NM1, NM3, PM3, and PM4. The other signal of the differential output current signals flowing through the transistor NM2 is supplied to the output terminal OUT via the current mirror circuit including the transistors NM2 and NM4. The one signal of the differential current signals is supplied to the output terminal OUT to allow the current to flow out (be pushed) to the outside, and the other signal of the differential current signals is supplied to draw (pull) the current from the outside to the output terminal OUT. As described, the difference current obtained by subtracting the other signal of the differential current signals from the one signal of the differential current signals is output from the output terminal OUT as the differential current signal. The transistors PM4 and NM4 constitute a push-pull circuit.

The transistor PM5 functions as a variable resistor circuit in which the resistance value (on-resistance) between the source and the drain changes in accordance with the gain control voltage VG. Therefore, the gain (gm) of the OTA 51A can be controlled by the gain control voltage VG.

Figure 9:
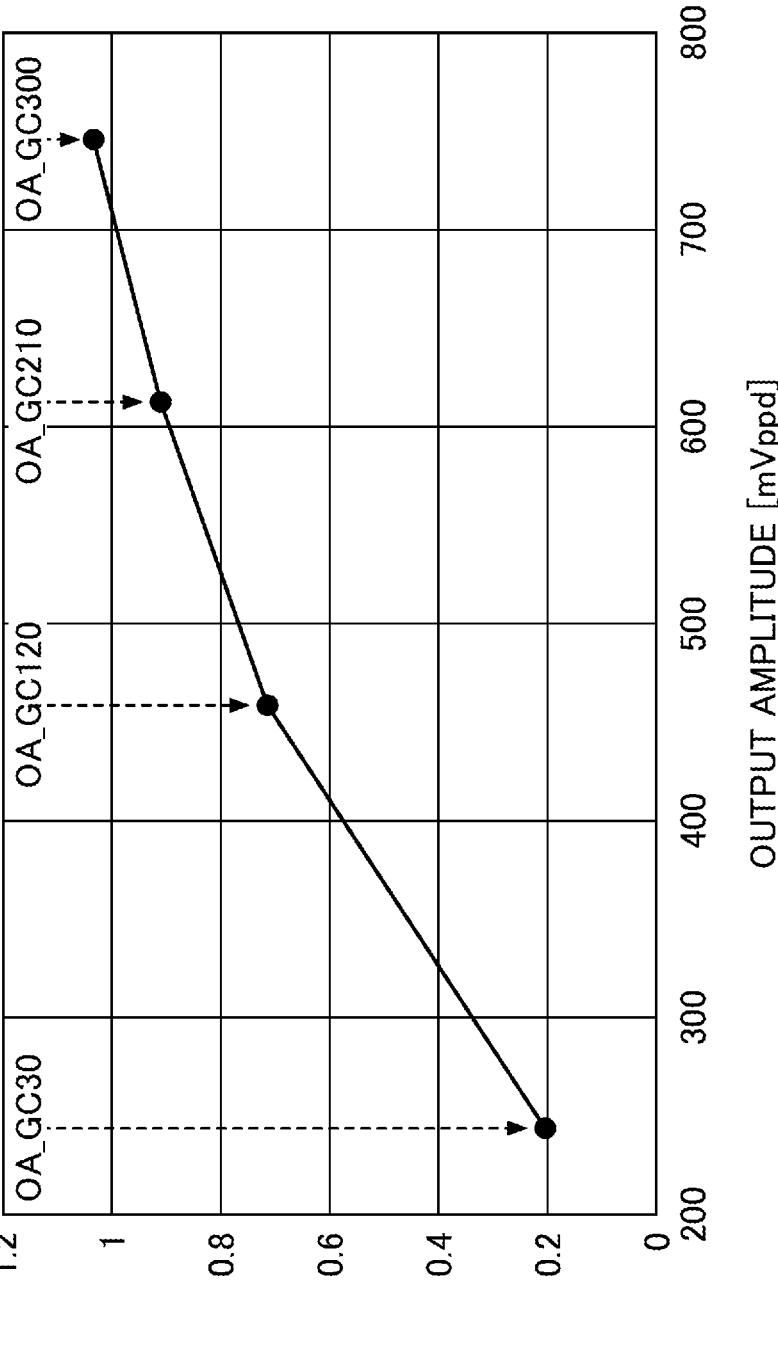
FIG. 9 is a graph depicting an example of a gain control voltage that is set in accordance with the amplitude setting signal.
Figure 11:
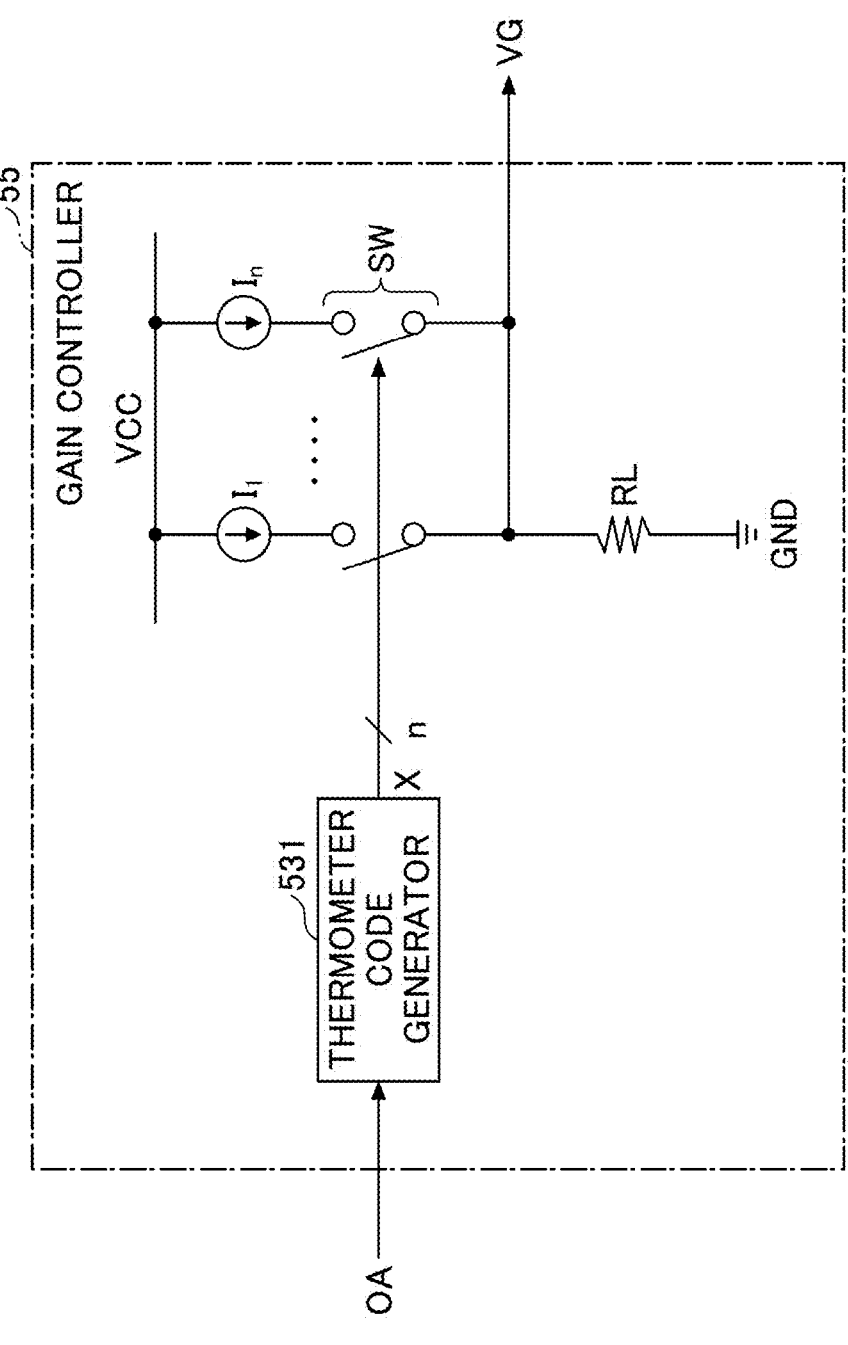
FIG. 11 is a circuit diagram illustrating an example of the gain controller of FIG. 7.

FIG. 9 is a graph depicting an example of the gain control voltage VG set in accordance with the output amplitude setting signal OA. The numerical values at the end of the symbols OA_GC30, OA_GC120, OA_GC210, and OA_GC300 indicated in FIG. 9 correspond to the set magnitudes of the amplitude, and as the numerical value increases, the output amplitude setting signal OA having an increased value is supplied to the DAC 52 and the gain controller 55. The horizontal axis of FIG. 9 represents the output amplitude of the differential output voltage output from the output terminals OutP and OutN. In this example, the gain control voltage VG is set larger as the output amplitude increases. When the voltage value of the gain control voltage VG is relatively small, the on-resistance of the p-channel MOS transistor PM5 decreases, and the gain of the OTA 51A increases. When the voltage value of the gain control voltage VG is relatively large, the on-resistance of the p-channel MOS transistor PM5 increases, and the gain of the OTA 51A decreases. An example of the gain controller 55 that sets the gain control voltage VG is illustrated in FIG. 11. Here, the OTA 51 of the AGC circuit 50 illustrated in FIG. 2 has a specific gain. For example, by adjusting the gain control voltage VG input to the OTA 51A, the gain of the OTA 51A can be adjusted equal to the gain of the OTA 51. Thus, the OTA 51A to which a constant voltage value is applied as the gain control voltage VG may be used as the OTA 51. Alternatively, in a circuit configuration in which the p-channel MOS transistor PM5 is removed from the circuit configuration illustrated in FIG. 8, the OTA 51A may be used as the OTA 51 by appropriately selecting the electrical characteristics of the respective circuit elements that constitute the circuit.

Figure 10:
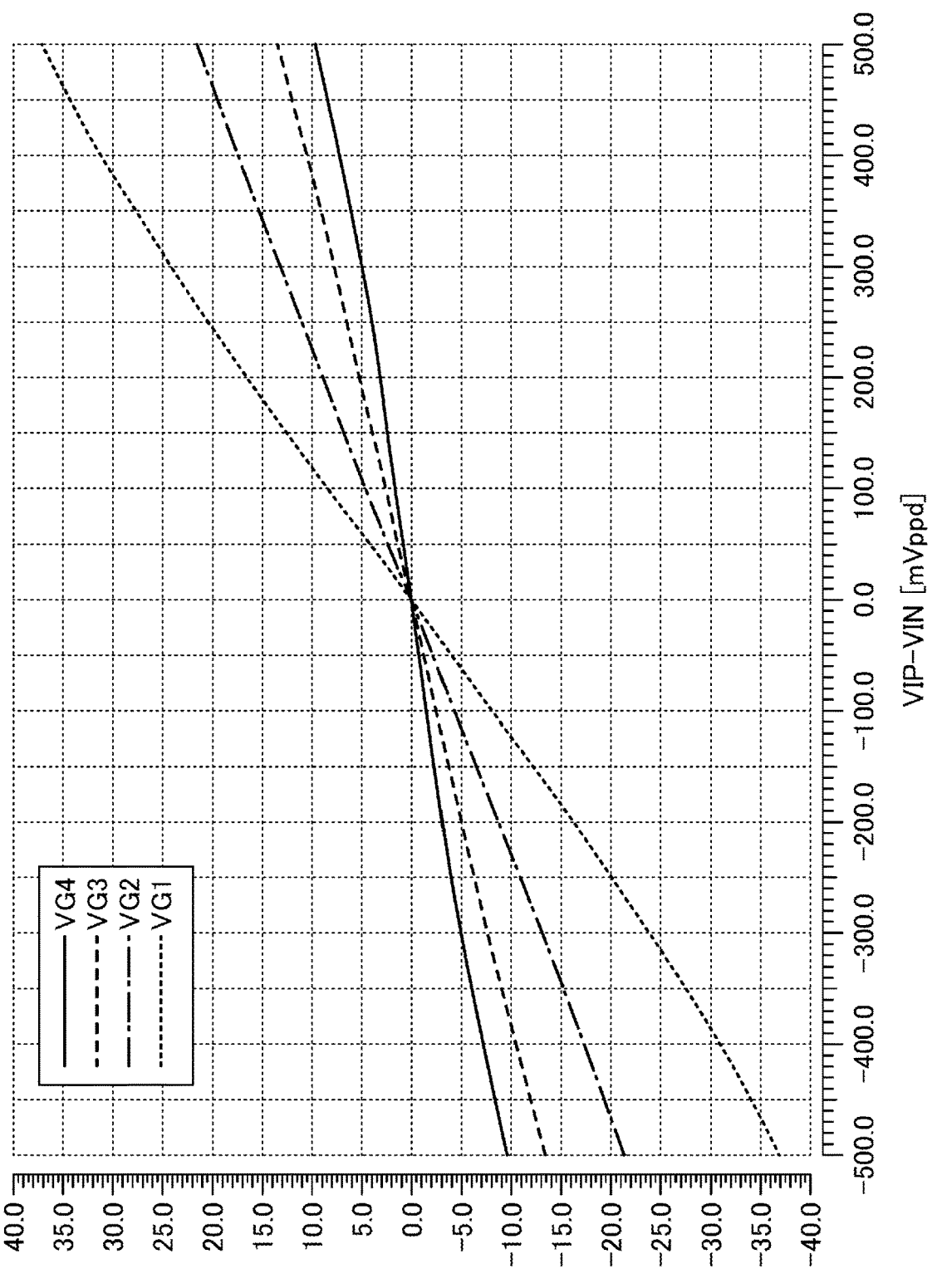
FIG. 10 is a characteristic graph indicating an example of an output current that is output from an output terminal of the OTA in accordance with the set gain control voltage.

FIG. 10 is a characteristic graph indicating an example of a differential current signal Iout output from the output terminal OUT of the OTA 51A in accordance with the input differential voltage VIP-VIN with respect to the set gain control voltage VG. FIG. 10 indicates the input/output characteristics of the OTA 51 with respect to the four gain control voltages VG indicated by the symbols VG1 to VG4. The horizontal axis of FIG. 10 represents the differential input voltage VIP-VIN, and the vertical axis represents the differential current signal Iout. The current value of the differential current signal Iout is positive in the direction of the flowing-out from the output terminal OUT to the outside and negative in the direction of flowing-in from the outside to the output terminal OUT. The lines representing four gain control voltages VG1 to VG4 correspond to the lines used with the symbols OA_GC30, OA_GC120, OA_GC210, and OA_GC300 illustrated in FIG. 12 below.

For example, the gain control voltage VG1 is generated in response to receiving the output amplitude setting signal OA that sets the smallest output amplitude. The gain control voltage VG2 is generated in response to receiving the output amplitude setting signal OA that sets the second smallest output amplitude. The gain control voltage VG3 is generated in response to receiving the output amplitude setting signal OA that sets the second largest output amplitude. The gain control voltage VG4 is generated in response to receiving the output amplitude setting signal OA that sets the largest output amplitude.

The gain control voltages VG1, VG2, VG3, and VG4 sequentially increase in this order (VG1<VG2<VG3<VG4). In FIG. 10, the slopes of respective lines corresponding to the gain control voltage VG1 to VG4 correspond to the gain of the OTA 51A. Therefore, the gain of the OTA 51A decreases as the gain control voltage VG increases, and the gain of the OTA 51A increases as the gain control voltage VG decreases. That is, the gain of the OTA 51A can be made greater as the output amplitude set by the output amplitude setting signal OA decreases, and the gain of the OTA 51A can be made less as the output amplitude set by the output amplitude setting signal OA increases.

FIG. 11 is a circuit diagram illustrating an example of the gain controller 55 of FIG. 7. The gain controller 55 includes a thermometer code generator 531, n current sources I1 to In (n is an integer greater than or equal to 2) connected in parallel to each other, n switches SW connecting the current sources I1 to In to a gain control voltage line (a voltage output node) VG, and a resistor circuit RL connected between the gain control voltage line VG and the grounding line GND. For example, the current source I1 is connected to the gain control voltage line VG via the first switch SW and the current source In is connected to the gain control voltage line VG via the nth switch SW. When all switches SW are turned on, n current sources I1 to In are connected in parallel to the gain control voltage line VG, and the current is supplied to the resistor circuit RL from each of the n current sources I1 to In. The gain control voltage is generated by a current, supplied by the current source connected to the voltage output node via the switch SW among the n current sources I1 to In, flowing to the resistor circuit. The gain control voltage VG is output from the voltage output node.

The thermometer code generator 531 generates n output signals that control the switching (ON/OFF) of the switches SW in accordance with the value of the output amplitude setting signal OA. For example, the first output signal controls the switching of the first switch SW, the second output signal controls the switching of the second switch SW, and the nth output signal controls the switching of the nth switch SW. When the switch SW is turned off, the switch SW becomes a non-conducting state (the OFF state). When the switch SW is turned on, the switch SW becomes a conducting state (the ON state). For example, as described with reference to FIG. 9 and FIG. 10, four values of the output amplitude setting signal OA are used to set four amplitudes. In this case, the thermometer code generator 531 generates an output signal so as to increase the number of the switches SW to be turned on as the value of the output amplitude setting signal OA increases. For example, the thermometer code generator 531 may be configured in the same manner as the thermometer code generator 53 of the AGC circuit 50 illustrated in FIG. 2.

For example, when the output amplitude setting signal OA is the value that sets the smallest amplitude, only the first output signal is set to turn on the switch SW, and the other output signals are set to turn off the respective switches SW connected to the corresponding current sources. When the output amplitude setting signal OA is the value that sets the second smallest amplitude, only the first output signal and the second output signal are set to turn on the respective switches SW connected to the corresponding current sources, and the other output signals are set to turn off the respective switches SW connected to the corresponding current sources. As described, for example, the thermometer code generator 531 is configured so that when the value of the output amplitude setting signal OA increases by 1 or increases to a next larger value, only one switch SW switches from the OFF state to the ON state.

For example, in the thermometer code, $2^m$ output signals can be generated in accordance with values of m output amplitude setting signals OA (where m is an integer greater than or equal to 1). For example, in the thermometer code, as the digital value A of the output amplitude setting signal OA increases by one, the number of the switches SW that are turned on increases by one. Therefore, when the digital value A is incremented or decremented by 1, only one switch SW is turned on or off accordingly, and thus the current flowing through the resistor circuit RL can be monotonically incremented or decremented without being influenced by the timing of the output signal X. For example, when two switches SW are controlled simultaneously without using the thermometer code, specifically, when one switch SW switches from the OFF state to the ON state and the other switch SW switches from the ON state to the OFF state, there is a possibility that the monotonic change of the gain control voltage VG caused by the resistor circuit RL is not guaranteed due to the shift between the timings of the respective output signals X. By adjusting the gain of the OTA 51 in accordance with the output amplitude setting signal OA, the AGC band can be maintained constant regardless of the value of the output amplitude setting signal OA.

Here, in n amplitude settings, when the gain control voltage VG of the desired AGC band is V1 to Vn, I1 to In can be obtained as follows.

$$I1 = V1/RL$$

$$I2 = V2/RL - I1$$

$$\ldots$$

$$In = Vn/RL - \Sigma(k=1, n-1)Ik$$

Here, a portion subsequent to the symbol Σ indicates the current Ik when k is changed from "1" to "n−1," and the symbol Σ indicates the integration of the current Ik.

[Loop Gain of the Second Embodiment]

Figure 12:
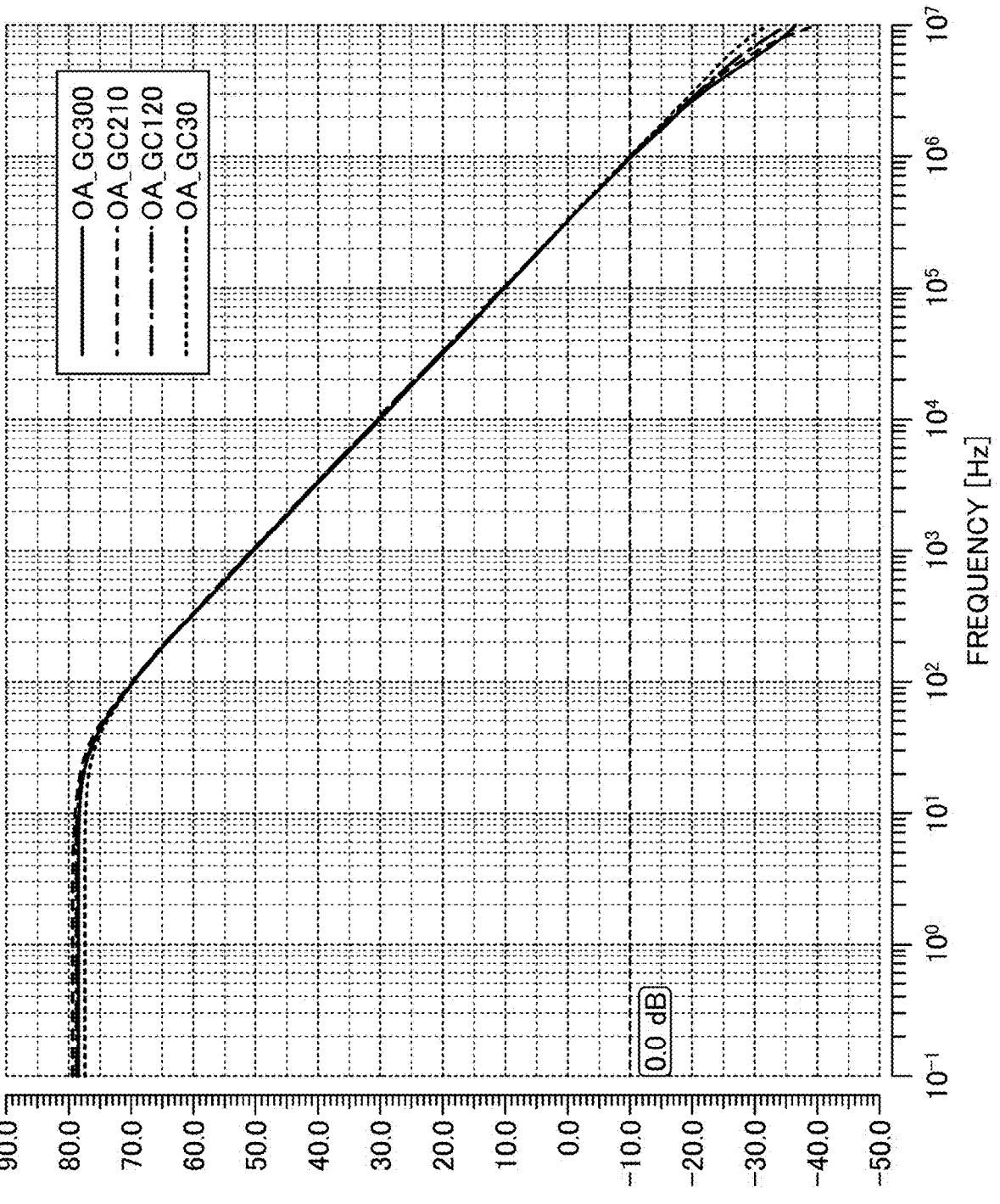
FIG. 12 is a characteristic graph indicating an example of an AGC loop gain in accordance with an amplitude set by the output amplitude setting signal in the AGC circuit of FIG. 7.

FIG. 12 is a characteristic graph indicating an example of the loop gain of the AGC loop in accordance with the amplitude setting of the output amplitude setting signal OA in the AGC circuit 50A of FIG. 7. FIG. 12 indicates the frequency characteristics of the AGC loop gain when the optical input signal power is constant (e.g., −15 dBm). When the optical input signal power is constant, the magnitude of the differential input current signals received at the input terminals InP and InN is constant. The values at the end of the symbols OA_GC30, OA_GC120, OA_GC210, and OA_GC300 indicated in FIG. 12 correspond to the values of the output amplitude setting signal OA, as described with reference to FIG. 9.

The AGC band can be obtained as the frequency at which the gain is "1" (0 dB in decibels) in the loop gain characteristic of the AGC loop, as described above. For example, the proper range of the AGC band is 100 kHz to 1 MHz. In this embodiment, the AGC band can be set to about 300 kHz regardless of the amplitude setting by changing the gain of the OTA 51 in accordance with the amplitude setting. 300 kHz is located near the center of the proper range of the AGC band, and the desired communication performance can be obtained even when the optical input signal power changes.

Figure 13:
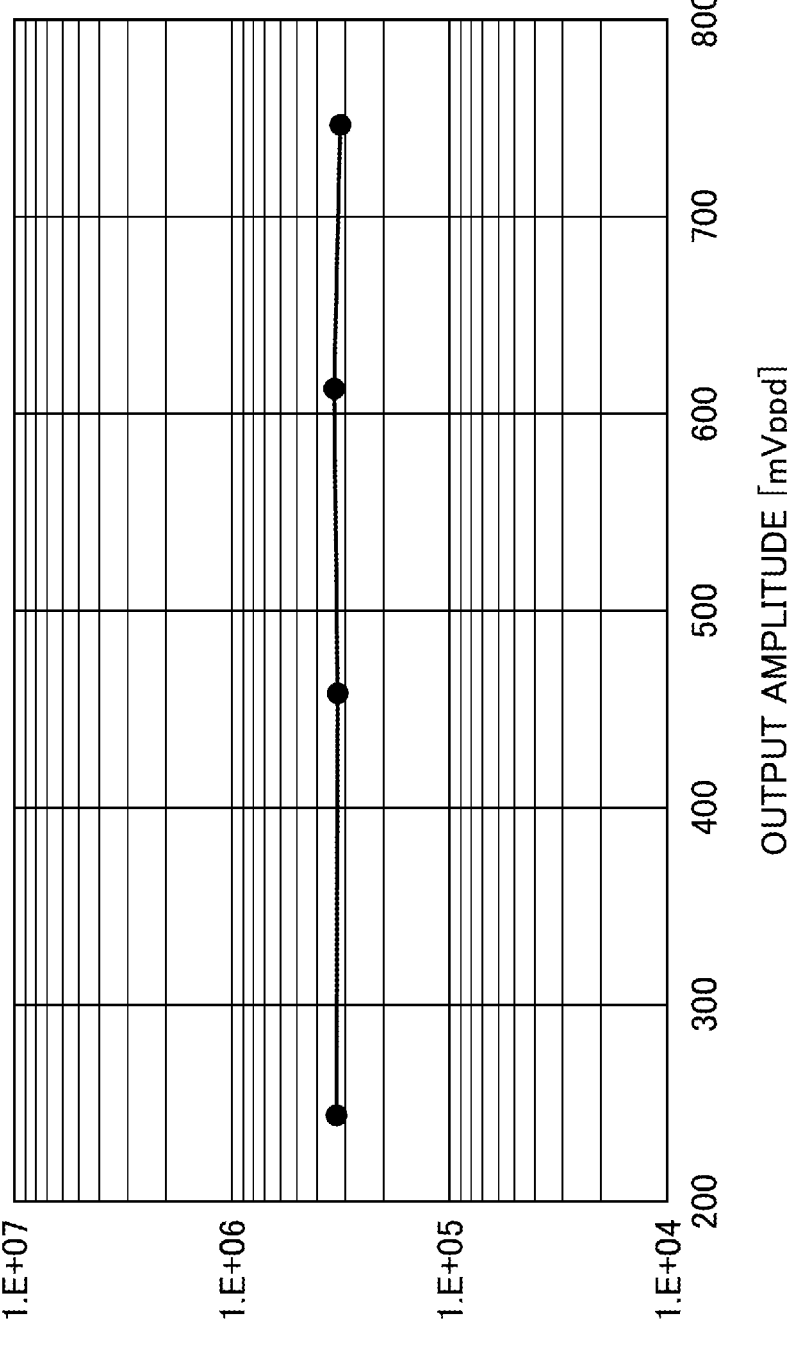
FIG. 13 is a characteristic graph indicating the characteristics indicated in FIG. 12 as an AGC band with respect to an output amplitude.

FIG. 13 is a characteristic graph indicating the characteristics indicated in FIG. 12 as the AGC band with respect to the output amplitude. As indicated in FIG. 13, the AGC band can be stabilized substantially constant regardless of the output amplitude set by the output amplitude setting signal OA.

As described above, in this embodiment, by changing the gain of the OTA 51A in accordance with the amplitude setting, the AGC band can be stabilized constant, regardless of the size of the output amplitude to be set. That is, the transimpedance amplifier circuit 100A that suppresses the change of the AGC band due to amplitude setting can be provided. As a result, the sufficient communication performance can be obtained when the desired output amplitude is set for the change in the optical input signal power.

The transistor PM5 in which the resistance value between the source and the drain changes in accordance with the gain control voltage VG is connected between the sources of the transistors PM1 and PM2 that receive the differential voltage signals VIP and VIN. This can change the gain of the voltage control current source circuit in accordance with the gain control voltage VG with a simple means, and compensate for the change in the AGC band due to the output amplitude.

By setting the number of the current sources I1 to In connected to the gain control voltage line VG in accordance with the value of the output amplitude setting signal OA by using the thermometer code, the gain control voltage VG can be stably generated without being influenced by the timings of the output signals that connect or disconnect the current sources I1 to In with a simple means.

By supplying the offset current Ioffset to the connection node OFS of the differential amplifier circuit in accordance with the output amplitude setting signal OA, the offset voltage corresponding to the amplitude indicated by the output amplitude setting signal OA can be easily reflected in the output of the differential amplifier circuit without adding a circuit. As a result, the amplitude of the differential voltage signals IP and IN can be set to the output amplitude indicated by the output amplitude setting signal OA.

[Circuit Configuration of Another AGC Circuit]

FIG. 14 is a circuit diagram illustrating another configuration example of the AGC circuit mounted in the transimpedance amplifier circuit 100 of FIG. 1. Substantially the same elements as in FIG. 2 are referenced by the same signs, and the detailed description is omitted. An AGC circuit 500 illustrated in FIG. 14 is mounted on the transimpedance amplifier circuit 100 illustrated in FIG. 1 instead of the AGC circuit 50 illustrated in FIG. 1. Alternatively, the AGC circuit 500 illustrated in FIG. 14 is mounted on the transimpedance amplifier circuit 100A illustrated in FIG. 6 instead of the AGC circuit 50A illustrated in FIG. 7.

In the AGC circuit 500, the thermometer code generator 53 and the switches SW are removed from the AGC circuit 50 of FIG. 2 and the capacitor circuit C2 is included instead of the capacitor circuits C2,1 to C2,*n*. The other configuration of the AGC circuit 500 is substantially the same as the configuration of the AGC circuit 50 of FIG. 2. The AGC circuit 500 operates in the same manner as the AGC circuit 50 of FIG. 2, except that the adjustment of the capacitance value by the output amplitude setting signal OA is not performed. Additionally, in the AGC circuit 500, the gain controller 55 is removed from the AGC circuit 50A illustrated in FIG. 7. Additionally, in the OTA 51, the transistor PM5 is removed from the OTA 51A illustrated in FIG. 8. The other configuration of the AGC circuit 500 is substantially the same as the configuration of the AGC circuit 50A illustrated in FIG. 7. The AGC circuit 500 operates in the same manner as the AGC circuit 50A of FIG. 7, except that the adjustment of the gain of the OTA 51A by the output amplitude setting signal OA is not performed.

[Loop Gain of Another AGC Circuit]

Figure 15:
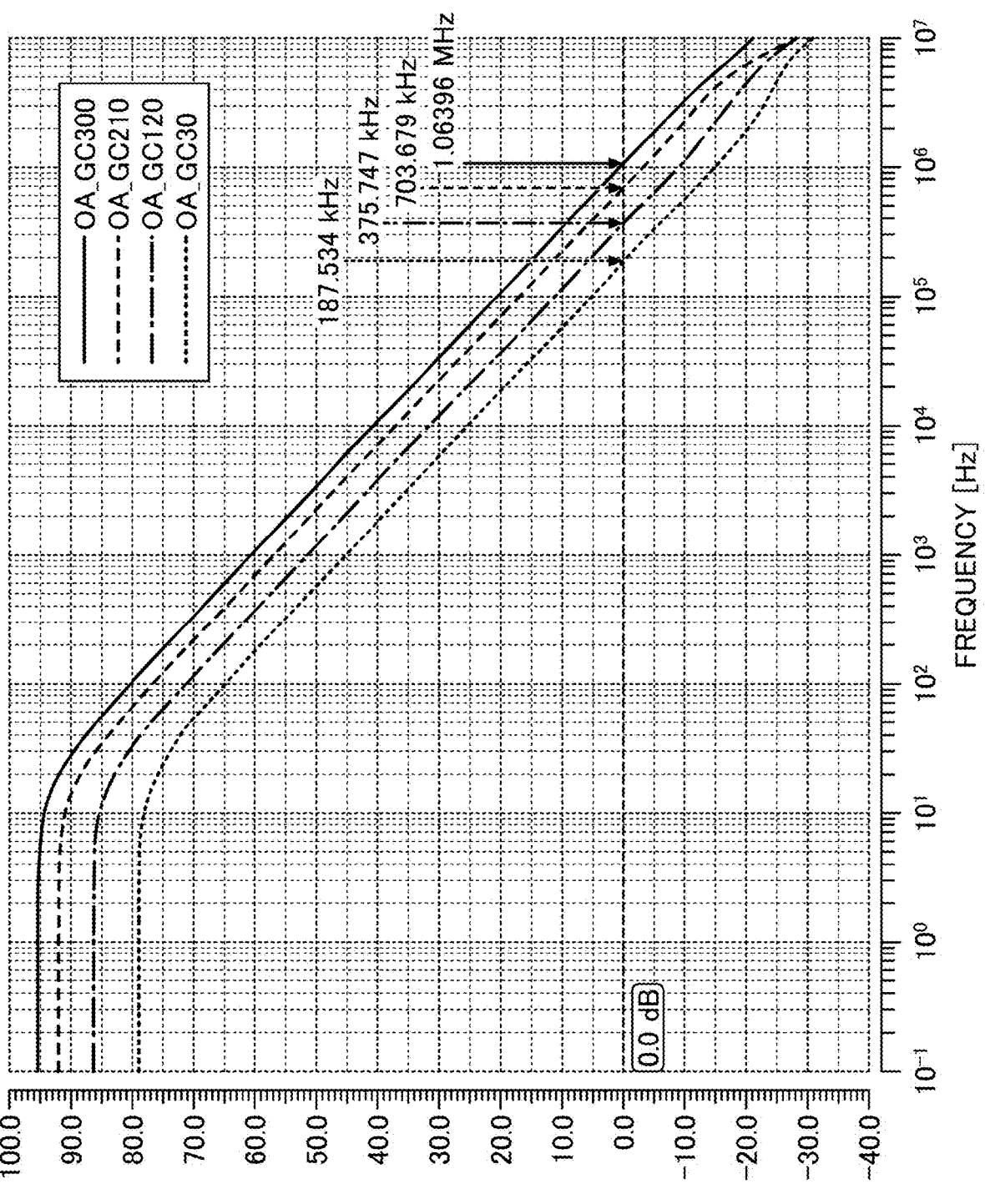
FIG. 15 is a characteristic graph indicating an example of an AGC loop gain in accordance with an amplitude set by an output amplitude setting signal in the AGC circuit of FIG. 14.

FIG. 15 is a characteristic graph indicating an example of the AGC loop gain in accordance with the amplitude setting by the output amplitude setting signal OA in the AGC circuit 500 of FIG. 14. FIG. 15 corresponds to FIG. 4 and indicates the characteristics of the AGC loop gain when the optical input signal power is constant (e.g., −15 dBm). Additionally, FIG. 15 corresponds to FIG. 12 and indicates the characteristics of the AGC loop gain when the optical input signal power is constant (e.g., −15 dBm). When the optical input signal power is constant, the magnitude of the differential input current signals received at the input terminals InP and InN is constant.

The AGC band changes in accordance with the set output amplitude when no adjustment of the capacitance value by the output amplitude setting signal OA is performed or when no adjustment of the gain by the output amplitude setting signal OA is performed. In FIG. 15, the AGC band changes from about 180 kHz to about 1 MHz, and a margin for the proper range of 100 kHz to 1 MHz is small. Therefore, when the optical input signal power changes, there is a possibility that the desired communication performance cannot be obtained.

FIG. 16 is a characteristic graph indicating the characteristics indicated in FIG. 15 as the AGC band with respect to the output amplitude. In FIG. 16, the AGC band changes in accordance with the amplitude set by the output amplitude setting signal OA.

[Characteristics when the Feedback Function is Disabled]

Figure 17:
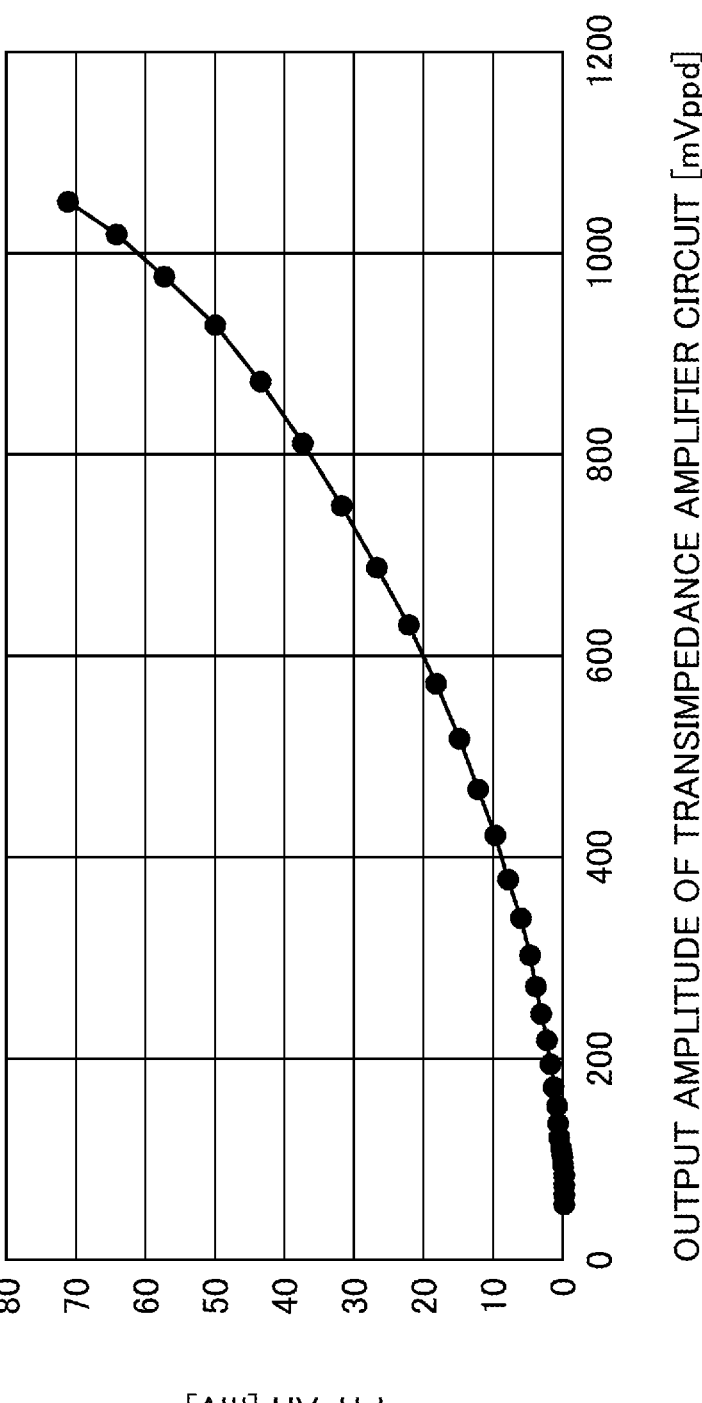
FIG. 17 is a characteristic graph indicating a relationship between the output amplitude of the transimpedance amplifier circuit and the amplitude detection signal when a feedback function of the AGC circuit of FIG. 2, FIG. 7.

FIG. 17 is a characteristic graph indicating a relationship between the output amplitude of the transimpedance amplifier circuit 100 and the differential voltage PH-AH between the amplitude detection signal PH and the amplitude reference signal AH when the negative feedback of the AGC circuit of FIG. 2, FIG. 7, or FIG. 14 is disabled. As indicated in FIG. 17, when the negative feedback is disabled, as the set amplitude increases, the differential voltage PH-AH increases nonlinearly in a curved line. In the setting circuit of the AGC circuit 50, when the reference voltage Vref is set to the mean value of the differential voltage signals IP and IN, the differential voltage PH-AH is a voltage corresponding to the value of the amplitude (half of the peak to peak value) of the differential voltage signals IP and IN.

Here, the change in the AGC band indicated in FIG. 16 occurs because the gain of the AGC loop changes in accordance with the amplitude setting and there are two main causes. First, because the core amplifier 10 and the VGA 20 are included within the AGC loop, the AGC loop gain changes due to the change in the gain of the core amplifier 10 and the VGA 20 by the AGC control. Second, the transistors Q1P and Q1N (e.g., HBT) in FIGS. 2, 7 and 14 have non-linear characteristics relative to the input because the transistors Q1P and Q1N have diode characteristics between the base and the emitter. For example, the relationship between the differential voltage PH-AH and the actual output amplitude in FIG. 17 is non-linear due to the non-linear characteristics of the transistors Q1P and Q1N.

Although the embodiments of the present disclosure have been described above, the present disclosure is not limited to the above-described embodiments. Various alterations, modifications, substitutions, additions, deletions, and combinations can be made within the scope of the claims. They are of course within the technical scope of the present disclosure.

What is claimed is:

1. A transimpedance amplifier circuit comprising:
an amplifier circuit configured to convert an input current signal into a voltage signal with a gain being varied in accordance with a control signal; and
a gain control circuit configured to generate the control signal in accordance with an amplitude of the voltage signal, the gain control circuit including:
a detection circuit configured to generate an amplitude detection signal in accordance with the amplitude of the voltage signal,
a setting circuit configured to generate an amplitude reference signal in accordance with a reference voltage,
a differential voltage generation circuit configured to generate a differential voltage signal in accordance with a voltage difference between the amplitude detection signal and the amplitude reference signal, the differential voltage signal being offset from the voltage difference based on an amplitude setting signal,
an operational transconductance amplifier (OTA) configured to generate a differential current signal in accordance with the differential voltage signal, and
a variable capacitor circuit connected to an output of the OTA, the variable capacitor circuit having a variable capacitance being varied in accordance with the amplitude setting signal, and being configured to be charged and discharged by the differential current signal and output a charging voltage,
wherein the control signal is generated in accordance with the charging voltage,
wherein the differential voltage generation circuit includes a current source, a first transistor, a second transistor, a first resistor, and a second resistor,
wherein the current source is connected to both a source of the first transistor and a source of the second transistor,
wherein the amplitude detection signal is input to a gate of the first transistor and the amplitude reference signal is input to a gate of the second transistor,
wherein the first resistor is connected between a drain of the first transistor and a grounding line, and the second resistor is connected between a drain of the second transistor and the grounding line, wherein the differential voltage signal is output from the drain of the first transistor and the drain of the second transistor, wherein the gain control circuit further includes a current generator configured to generate an offset current in accordance with a value indicated by the amplitude setting signal, wherein the differential voltage generation circuit further includes a third resistor connected between the first transistor and the grounding line, and wherein the offset current is input to a node between the first resistor and third resistor.

2. The transimpedance amplifier circuit claimed in claim 1, wherein the gain control circuit includes a switch controller configured to generate a switch control signal in accordance with the amplitude setting signal, wherein the variable capacitor circuit includes a plurality of capacitor circuits connected to the output of the OTA via switches, each of the switches being turned on to connect a corresponding capacitor circuit to the output of the OTA among the plurality of capacitor circuits or turned off to disconnect the corresponding capacitor circuit, in accordance with the switch control signal, and wherein the switch controller generates the switch control signal that increases a number of the plurality of capacitor circuits connected to the output of the OTA, as an amplitude indicated by the amplitude setting signal increases.

3. The transimpedance amplifier circuit claimed in claim 2, wherein the switch controller generates the switch control signal so that only one of off-switches is turned on when a digital value of the amplitude setting signal increases by one, the off-switches being in an OFF state among the switches.

4. The transimpedance amplifier circuit claimed in claim 1, wherein the differential voltage generation circuit includes:

a current generator configured to generate an offset current in accordance with a value indicated by the amplitude setting signal, and a differential amplifier circuit configured to amplify the voltage difference between the amplitude detection signal and the amplitude reference signal and add a voltage obtained in accordance with the offset current to a voltage obtained from the amplitude detection signal by the amplifying of the voltage difference.

5. A transimpedance amplifier circuit comprising:

an amplifier circuit configured to convert an input current signal into a voltage signal with a first gain being varied in accordance with a control signal; and a gain control circuit configured to generate the control signal in accordance with an amplitude of the voltage signal, the gain control circuit including:

a detection circuit configured to generate an amplitude detection signal in accordance with the amplitude of the voltage signal, a setting circuit configured to generate an amplitude reference signal in accordance with a reference voltage, a differential voltage generation circuit configured to generate a differential voltage signal in accordance with a voltage difference between the amplitude detection signal and the amplitude reference signal, the differential voltage signal being offset from the voltage difference based on an amplitude setting signal, an operational transconductance amplifier (OTA) configured to generate a differential current signal from the differential voltage signal with a second gain being varied in accordance with the amplitude setting signal, and a capacitor circuit configured to be charged and discharged by the differential current signal and output a charging voltage, wherein the control signal is generated in accordance with the charging voltage, wherein the differential voltage generation circuit includes a current source, a first transistor, a second transistor, a first resistor, and a second resistor, wherein the current source is connected to both a source of the first transistor and a source of the second transistor, wherein the amplitude detection signal is input to a gate of the first transistor and the amplitude reference signal is input to a gate of the second transistor, wherein the first resistor is connected between a drain of the first transistor and a grounding line, and the second resistor is connected between a drain of the second transistor and the grounding line, wherein the differential voltage signal is output from the drain of the first transistor and the drain of the second transistor, wherein the gain control circuit further includes a current generator configured to generate an offset current in accordance with a value indicated by the amplitude setting signal, wherein the differential voltage generation circuit further includes a third resistor connected between the first transistor and the grounding line, and wherein the offset current is input to a node between the first resistor and third resistor.

6. The transimpedance amplifier circuit claimed in claim 5, wherein the gain control circuit includes a gain controller configured to generate a gain control voltage for setting the second gain in accordance with the amplitude setting signal, wherein the OTA includes a pair of transistors configured to amplify the differential voltage signal and a variable resistor portion in which a resistance value is varied in accordance with the gain control voltage, the variable resistor portion being connected between sources of the pair of transistors.

7. The transimpedance amplifier circuit claimed in claim 6, wherein the gain controller includes:

a voltage output node that outputs the gain control voltage;

a resistor circuit connected to the voltage output node;

a plurality of current sources connected in parallel to each other;

a thermometer code generator configured to generate an output signal in accordance with the amplitude setting signal; and a switch configured to change a number of the plurality of current sources connected to the voltage output node, in accordance with the output signal, wherein the gain control voltage is generated by a current supplied by the plurality of current sources connected to the voltage output node via the switch flowing through the resistor circuit, and wherein the output signal increments or decrements, by one, the number of the plurality of current sources connected to the voltage output node when a value of the amplitude setting signal is incremented or decremented by one.

8. The transimpedance amplifier circuit claimed in claim 5, wherein the differential voltage generation circuit includes:

a current generator configured to generate an offset current in accordance with a value indicated by the amplitude setting signal, and a differential amplifier circuit configured to amplify the voltage difference between the amplitude detection signal and the amplitude reference signal and add a voltage obtained in accordance with the offset current to a voltage obtained from the amplitude detection signal by the amplifying of the voltage difference.

9. The transimpedance amplifier circuit claimed in claim 1, wherein the operational transconductance amplifier includes an upper current mirror circuit connected to a power supply line and a lower current mirror circuit connected to a grounding line, and wherein the upper current mirror circuit pushes the differential current signal to an outside of the operational transconductance amplifier for charging, and the lower current mirror circuit alternatively pulls the differential current signal from the outside for discharging.

* * * * *